(12) United States Patent
Miyata et al.

(10) Patent No.: US 9,268,219 B2
(45) Date of Patent: Feb. 23, 2016

(54) PHOTORESIST COMPOSITION AND RESIST PATTERN-FORMING METHOD

(71) Applicant: JSR CORPORATION, Tokyo (JP)

(72) Inventors: Hiromu Miyata, Tokyo (JP); Hiromitsu Nakashima, Tokyo (JP); Masafumi Yoshida, Tokyo (JP)

(73) Assignee: JSR Corporation, Tokyo (JP)

( * ) Notice: Subject to any disclaimer, the term of this patent is extended or adjusted under 35 U.S.C. 154(b) by 18 days.

(21) Appl. No.: 13/644,708

(22) Filed: Oct. 4, 2012

(65) Prior Publication Data

US 2013/0089817 A1    Apr. 11, 2013

(30) Foreign Application Priority Data

Oct. 7, 2011 (JP) ................. 2011-222429
Mar. 23, 2012 (JP) ................. 2012-068362

(51) Int. Cl.
| | |
|---|---|
| G03F 7/004 | (2006.01) |
| G03F 7/38 | (2006.01) |
| C08F 220/28 | (2006.01) |
| G03F 7/039 | (2006.01) |
| G03F 7/11 | (2006.01) |
| G03F 7/20 | (2006.01) |

(52) U.S. Cl.
CPC ............ *G03F 7/0046* (2013.01); *C08F 220/28* (2013.01); *G03F 7/0397* (2013.01); *G03F 7/11* (2013.01); *G03F 7/2041* (2013.01); *C08F 2220/282* (2013.01); *G03F 7/38* (2013.01)

(58) Field of Classification Search
CPC ....... G03F 7/0397; G03F 7/38; C08F 220/28; C08F 2220/282
USPC ........ 430/270.1, 910, 326; 526/266, 269, 281
See application file for complete search history.

(56) References Cited

U.S. PATENT DOCUMENTS

| | | | |
|---|---|---|---|
| 4,491,628 A | 1/1985 | Ito et al. | |
| 8,614,050 B2 * | 12/2013 | Bae et al. ................. | 430/270.1 |
| 2007/0269734 A1 | 11/2007 | Kimura et al. | |
| 2008/0038661 A1 | 2/2008 | Chiba et al. | |
| 2011/0177453 A1 * | 7/2011 | Masubuchi ........... | C07C 309/12 430/270.1 |
| 2012/0237874 A1 * | 9/2012 | Yamaguchi ........... | C07C 309/06 430/281.1 |
| 2013/0011783 A1 * | 1/2013 | Ober et al. ................. | 430/270.1 |

FOREIGN PATENT DOCUMENTS

| | | |
|---|---|---|
| JP | 59-45439 | 3/1984 |
| JP | 2006-227632 | 8/2006 |
| TW | 200936616 A | 9/2009 |
| TW | 201109843 A | 3/2011 |
| TW | 201126268 A | 8/2011 |
| TW | 201132655 A | 10/2011 |
| WO | WO 2005-069076 | 7/2005 |
| WO | WO 2006-035790 | 4/2006 |

OTHER PUBLICATIONS

Taiwanese Office Action for related application No. 101136499, dated May 16, 2014, 5 pages, with English language summary.

* cited by examiner

*Primary Examiner* — John S Chu
(74) *Attorney, Agent, or Firm* — Oblon, McClelland, Maier & Neustadt, L.L.P.

(57) ABSTRACT

A photoresist composition includes a polymer that includes a first structural unit shown by a formula (1), and an acid generator. $R^1$ represents a hydrogen atom, a fluorine atom, a methyl group, or a trifluoromethyl group. $R^2$ represents a divalent hydrocarbon group having 1 to 10 carbon atoms. A represents —COO—*, —OCO—*, —O—, —S—, or —NH—, wherein "*" indicates a site bonded to $R^3$. $R^3$ represents a single bond or a divalent hydrocarbon group having 1 to 10 carbon atoms. The polymer preferably further includes a second structural unit that includes an acid-labile group.

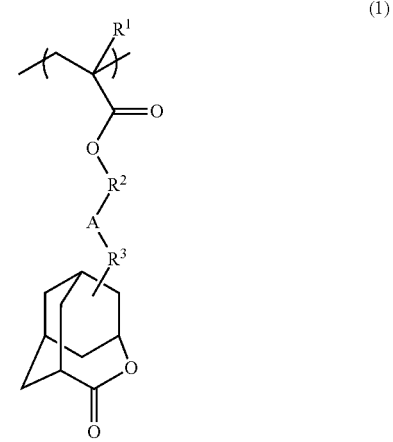

(1)

16 Claims, No Drawings

PHOTORESIST COMPOSITION AND RESIST PATTERN-FORMING METHOD

CROSS-REFERENCE TO RELATED APPLICATIONS

The present application claims priority under 35 U.S.C. §119 to Japanese Patent Application No. 2011-222429, filed Oct. 7, 2011 and to Japanese Patent Application No. 2012-068362, filed Mar. 23, 2012. The contents of these applications are incorporated herein by reference in their entirety.

BACKGROUND OF THE INVENTION

1. Field of the Invention

The invention relates to a photoresist composition and a resist pattern-forming method.

2. Discussion of the Background

In the field of microfabrication used to produce an integrated circuit device or the like, lithographic technology that utilizes short-wavelength radiation (e.g., KrF excimer laser light (wavelength: 248 nm) or ArF excimer laser light (wavelength: 193 nm)) has been under development in order to achieve a higher degree of integration. A resist material that exhibits high sensitivity, high resolution, and the like is required when using such an exposure light source. A chemically-amplified photoresist composition that includes an acid-labile group-containing component and an acid generator that generates an acid upon exposure to radiation has been normally used as the resist material (see Japanese Patent Application Publication (KOKAI) No. 59-45439). In recent years, technology that utilizes radiation having a wavelength shorter than that of excimer laser light (e.g., X-rays, electron beams (EB), or extreme ultraviolet (EUV) light) has been studied along with a further increase in the degree of integration (miniaturization) of devices.

SUMMARY OF THE INVENTION

According to one aspect of the present invention, a photoresist composition includes a polymer that includes a first structural unit shown by a formula (1), and an acid generator.

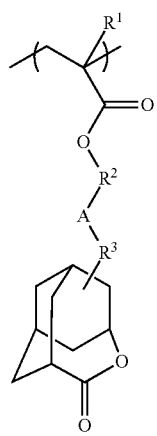

(1)

$R^1$ represents a hydrogen atom, a fluorine atom, a methyl group, or a trifluoromethyl group. $R^2$ represents a divalent hydrocarbon group having 1 to 10 carbon atoms. A represents —COO—*, —OCO—*, —O—, —S—, or —NH—, wherein "*" indicates a site bonded to $R^3$. $R^3$ represents a single bond or a divalent hydrocarbon group having 1 to 10 carbon atoms.

According to another aspect of the present invention, a resist pattern-forming method includes applying the photoresist composition on a substrate to form a resist film. The resist film is exposed. The exposed resist film is developed.

DESCRIPTION OF THE EMBODIMENTS

According to one aspect of the embodiment of the invention, a photoresist composition includes (A) a polymer that includes a structural unit (I) shown by a formula (1) (hereinafter may be referred to as "polymer (A)"), and (B) an acid generator.

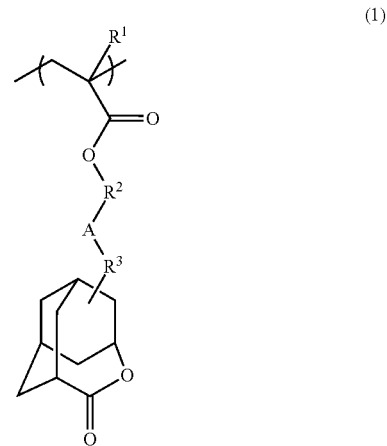

(1)

wherein $R^1$ represents a hydrogen atom, a fluorine atom, a methyl group, or a trifluoromethyl group, $R^2$ represents a divalent hydrocarbon group having 1 to 10 carbon atoms, A represents —COO—*, —OCO—*, —O—, —S—, or —NH—, "*" indicates a site bonded to $R^3$, and $R^3$ represents a single bond or a divalent hydrocarbon group having 1 to 10 carbon atoms.

The photoresist composition achieves excellent critical dimension uniformity (CDU), small line width roughness (LWR), and excellent cross-sectional shape rectangularity due to the polymer (A) and the acid generator (B). The reason why the photoresist composition having the above configuration achieves the above advantageous effects has not necessarily been clarified, but may be conjectured to be as follows, for example. The polymer (A) has a structure in which a lactone group having a specific structure (5-oxo-4-oxatricyclo[4.3.1.1$^{3,8}$]undecanyl group) is bonded to the polymer chain via a linking group. The polymer (A) highly interacts with an acid generated by the acid generator (B) due to the bulky specific lactone group that has moderate polarity and situated at a position relatively apart from the polymer chain, so that acid diffusion length (hereinafter may be referred to as "diffusion length") can be reduced, and diffusion of the acid can be appropriately controlled. The photoresist composition thus achieves improved CDU, small LWR, and improved cross-sectional shape rectangularity.

The polymer (A) preferably further includes a structural unit (II) that includes an acid-labile group.

When the polymer (A) includes the structural unit (II), the photoresist composition exhibits an improved pattern-forming capability. It is conjectured that the acid-labile group included in the structural unit (II) easily dissociates due to an acid when the polymer (A) includes the structural unit (II) that includes an acid-labile group together with the structural unit (I) that can reduce the diffusion length of the acid generated by the acid generator (B), so that the photoresist composition achieves improved CDU, small LWR, and improved cross-sectional shape rectangularity.

The structural unit (II) is preferably at least one structural unit selected from the group consisting of a structural unit shown by a formula (2-i), a structural unit shown by a formula (2-ii), and a structural unit shown by a formula (2-iii).

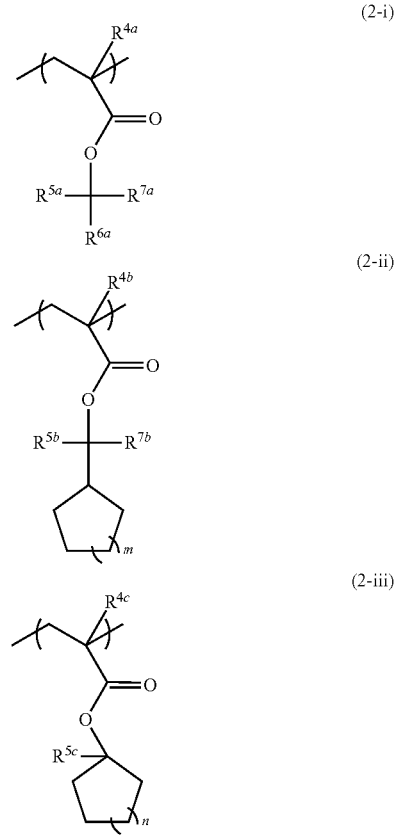

wherein $R^{4a}$ and $R^{4b}$, and $R^{4c}$ independently represent a hydrogen atom, a fluorine atom, a methyl group, or a trifluoromethyl group, $R^{5a}$, $R^{6a}$, and $R^{7a}$ independently represent a linear or branched alkyl group having 1 to 5 carbon atoms, provided that the total number of carbon atoms of the alkyl groups represented by $R^{5a}$, $R^{6a}$, and $R^{7a}$ is 7 or less, $R^{5b}$ and $R^{7b}$ independently represent a linear or branched alkyl group having 1 to 3 carbon atoms, m is an integer from 1 to 4, $R^{5c}$ represents a linear or branched alkyl group having 1 to 4 carbon atoms, and n is an integer from 1 to 4.

When the photoresist composition includes the structural unit (II) that includes an acid-labile group that has a relatively small structure, the photoresist composition achieves more excellent CDU, smaller LWR, and more excellent cross-sectional shape rectangularity.

The polymer (A) preferably further includes a structural unit (III) that includes at least one group selected from the group consisting of a lactone group, a cyclic carbonate group, and a sultone group (excluding the structural unit (I)). When the polymer (A) includes the structural unit (III), a resist film formed using the photoresist composition exhibits improved adhesion to a substrate or the like.

The content of the structural unit (I) in the polymer (A) is preferably 5 to 30 mol %. When the content of the structural unit (I) in the polymer (A) is within the above range, the acid diffusion length can be controlled within an appropriate range. As a result, the photoresist composition achieves improved CDU, small LWR, and improved cross-sectional shape rectangularity.

It is preferable that the acid generator (B) have an alicyclic structure having 8 to 30 carbon atoms. When the acid generator (B) has a bulky alicyclic structure, diffusion of the acid generated upon exposure can be more appropriately controlled. The photoresist composition that includes the acid generator (B) together with the polymer (A) achieves more excellent CDU, smaller LWR, and more excellent cross-sectional shape rectangularity.

The photoresist composition preferably further includes (C) a water-repellent polymer additive that includes a fluorine atom (hereinafter may be referred to as "water-repellent polymer additive (C)"). When the photoresist composition further includes the water-repellent polymer additive (C), the surface of a resist film formed using the photoresist composition exhibits excellent water repellency. Therefore, the resist film may suitably be used for liquid immersion lithography.

According to another aspect of the embodiment of the invention, a resist pattern-forming method includes (1) forming a resist film using the photoresist composition, (2) exposing the resist film, and (3) developing the exposed resist film.

The resist pattern-forming method can form a resist pattern that exhibits excellent CDU, small LWR, and excellent cross-sectional shape rectangularity by utilizing the photoresist composition.

Note that the term "radiation" used herein includes visible rays, ultraviolet rays, deep ultraviolet rays, X-rays, charged particle rays, EUV light, and the like. The term "organic group" used herein refers to a group that includes at least one carbon atom.

The photoresist composition and the resist pattern-forming method according to the embodiment of the invention can form a resist pattern that exhibits excellent CDU, small LWR, and excellent cross-sectional shape rectangularity. It is thus possible to stably form a fine pattern with high accuracy using radiation such as KrF excimer laser light or ArF excimer laser light as exposure light. The photoresist composition and the resist pattern-forming method may suitably be used for production of semiconductor devices that are expected to be further miniaturized in the future. The embodiments will now be described in detail.

Photoresist Composition

A photoresist composition according to an embodiment of the invention includes (A) a polymer and (B) an acid generator. The photoresist composition preferably further includes (C) a water-repellent polymer additive, (D) an acid diffusion controller, and (E) a solvent. The photoresist composition may further include an additional optional component as long as the effects of the invention are not impaired. Each component is described in detail below.

Polymer (A)

The polymer (A) includes a structural unit (I) shown by the formula (1). The structural unit (I) includes a 5-oxo-4-oxatricyclo[4.3.1.1$^{3,8}$]undecanyl group as a specific lactone group (see the formula (1)). The polymer (A) highly interacts with an acid generated by the acid generator (B) due to the structural unit (I) that includes the specific lactone group that is bulky and has moderate polarity at a position relatively apart from the polymer chain, so that the diffusion length of the acid can be reduced, and diffusion of the acid can be appropriately controlled. As a result, the photoresist composition achieves excellent CDU, small LWR, and excellent cross-sectional shape rectangularity.

The polymer (A) preferably further includes a structural unit (II) that includes an acid-labile group, and a structural unit (III) that includes at least one group selected from the group consisting of a lactone group, a cyclic carbonate group, and a sultone group (excluding the structural unit (I)) in addition to the structural unit (I). The polymer (A) may also include an additional structural unit (e.g., a structural unit that includes a hydrophilic functional group) in addition to the structural units (I) to (III). The polymer (A) may include only one type of each structural unit, or may include two or more types of each structural unit. Each structural unit is described in detail below.

Structural Unit (I)

The structural unit (I) is shown by the formula (1). $R^1$ in the formula (1) represents a hydrogen atom, a fluorine atom, a methyl group, or a trifluoromethyl group, $R^2$ represents a divalent hydrocarbon group having 1 to 10 carbon atoms, A represents —COO—*, —OCO—*, —O—, —S—, or —NH—, "*" indicates a site bonded to $R^3$, and $R^3$ represents a single bond or a divalent hydrocarbon group having 1 to 10 carbon atoms.

Examples of the divalent hydrocarbon group having 1 to 10 carbon atoms represented by $R^2$ and $R^3$ include chain-like hydrocarbon groups such as a methanediyl group, an ethanediyl group, a 1-methylethanediyl group, a 2-methylethanediyl group, a propanediyl group, and a butanediyl group; divalent alicyclic hydrocarbon groups obtained by eliminating two hydrogen atoms from alicyclic hydrocarbons such as cyclobutane, cyclopentane, cyclohexane, cyclooctane, norbornane, and adamantane; divalent aromatic hydrocarbon groups obtained by eliminating two hydrogen atoms from aromatic hydrocarbons such as benzene, toluene, xylene, and naphthalene; and the like.

$R^2$ preferably represents a chain-like hydrocarbon group or an alicyclic hydrocarbon, more preferably a methanediyl group, an ethanediyl group, a cyclopentanediyl group, or a cyclohexanediyl group, still more preferably a methanediyl group, an ethanediyl group, or a cyclohexanediyl group, and particularly preferably a methanediyl group, a 1,1-ethanediyl group, or a 1,4-cyclohexanediyl group. $R^3$ preferably represents a single bond.

A preferably represents —COO—*. A monomer that produces the structural unit (I) can be easily synthesized when the structural unit (I) includes A.

$R^3$ may be bonded to an arbitrary position of the lactone group included in the structural unit (I) shown by the formula (1). It is preferable that $R^3$ be bonded to a carbon atom at a position other than the bridgehead position (i.e., preferably bonded to the carbon atom at position 2, 7, 9, 10, or 11 of the 5-oxo-4-oxatricyclo[4.3.1.1$^{3,8}$]undecane structure). It is preferable that $R^3$ be bonded to the carbon atom at position 2 of the 5-oxo-4-oxatricyclo[4.3.1.1$^{3,8}$]undecane structure from the viewpoint of ease of synthesis of a monomer that produces the structural unit (I).

Examples of the structural unit (I) include structural units shown by the following formulas (1-1) to (1-8), and the like.

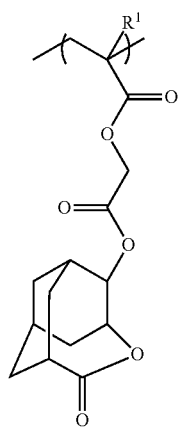

(1-1)

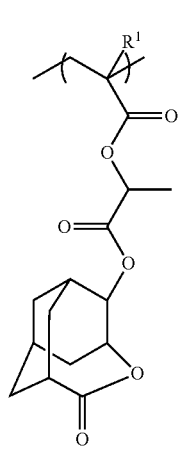

(1-2)

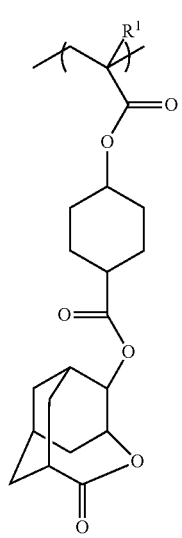

(1-3)

(1-4)
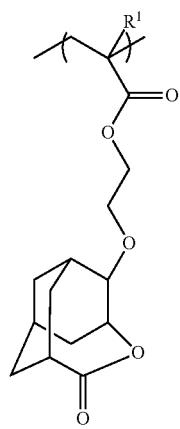
(1-5)
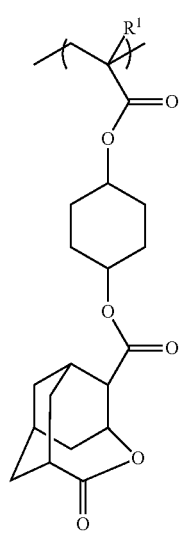
(1-6)
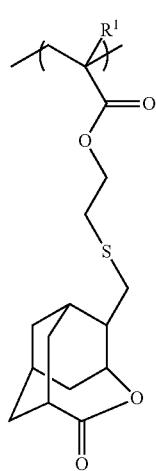
(1-7)
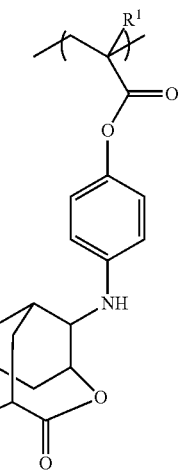
(1-8)
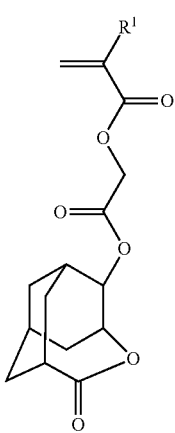
wherein $R^1$ is the same as defined for the formula (1).
Among these, the structural units shown by the formulas (1-1) to (1-3) are preferable.
Examples of a monomer that produces the structural unit (I) include compounds shown by the following formulas (i-1) to (i-8), and the like.
(i-1)

(i-2)
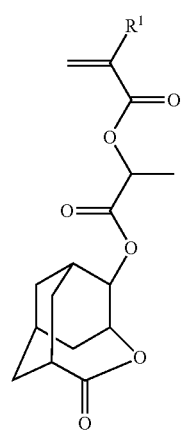
(i-3)
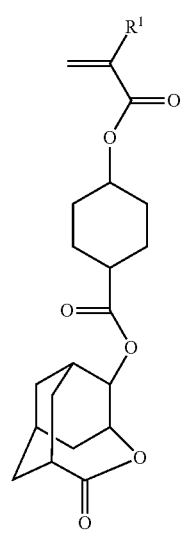
(i-4)
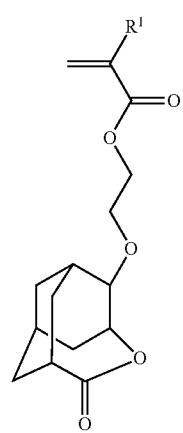
(i-5)
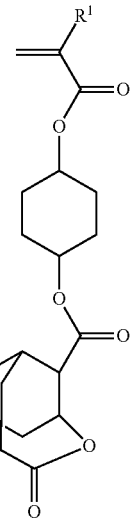
(i-6)
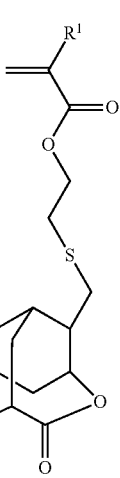
(i-7)
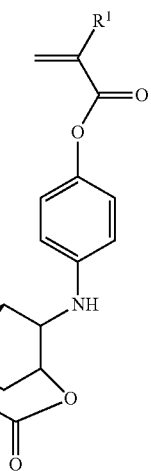

-continued

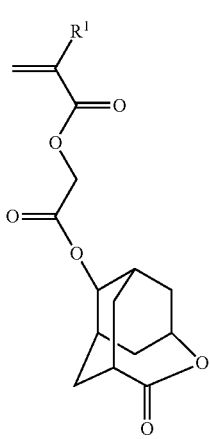
(i-8)

wherein R¹ is the same as defined for the formula (1).

Among these, the compounds shown by the formulas (i-1) to (i-3) are preferable.

The content of the structural unit (I) in the polymer (A) is preferably 1 to 40 mol %, more preferably 3 to 30 mol %, still more preferably 5 to 30 mol %, and particularly preferably 5 to 20 mol %. When the content of the structural unit (I) is within the above range, the photoresist composition can achieve improved CDU, small LWR, and improved cross-sectional shape rectangularity.

Structural Unit (II)

The structural unit (II) includes an acid-labile group. The term "acid-labile group" used herein refers to a group that substitutes the hydrogen atom of a carboxyl group, a hydroxyl group, or the like, and dissociates due to an acid. When the polymer (A) includes the structural unit (II), the photoresist composition exhibits an improved pattern-forming capability. It is conjectured that the acid-labile group included in the structural unit (II) easily dissociates due to an acid when the polymer (A) includes the structural unit (II) that includes an acid-labile group together with the structural unit (I) that can reduce the diffusion length of the acid generated by the acid generator (B), so that the photoresist composition achieves improved CDU, small LWR, and improved cross-sectional shape rectangularity. The structural unit (II) is not particularly limited as long as the structural unit (II) includes an acid-labile group. The structural unit (II) is preferably a structural unit shown by the following formula (2).

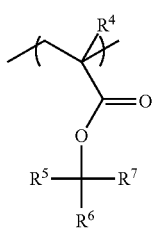
(2)

wherein $R^4$ represents a hydrogen atom, a fluorine atom, a methyl group, or a trifluoromethyl group, and $R^5$ to $R^7$ independently represent a linear or branched alkyl group having 1 to 10 carbon atoms, an alicyclic hydrocarbon group having 4 to 20 carbon atoms, or an aromatic hydrocarbon group having 6 to 20 carbon atoms, provided that $R^6$ and $R^7$ may bond to each other to form a divalent alicyclic hydrocarbon group having 4 to 20 carbon atoms together with the carbon atom bonded to $R^6$ and $R^7$.

Examples of the linear or branched alkyl group having 1 to 10 carbon atoms represented by $R^5$ to $R^7$ include a methyl group, an ethyl group, a 1-butyl group, an i-butyl group, a s-butyl group, a t-butyl group, an n-pentyl group, an i-pentyl group, an n-hexyl group, an i-hexyl group, an n-heptyl group, an i-heptyl group, an n-octyl group, an i-octyl group, an n-nonyl group, an i-nonyl group, an n-decyl group, an i-decyl group, and the like.

Examples of the alicyclic hydrocarbon group having 4 to 20 carbon atoms represented by $R^5$ to $R^7$ include a cyclobutyl group, a cyclopentyl group, a cyclohexyl group, a cyclooctyl group, a norbornyl group, an adamantyl group, and the like.

Examples of the aromatic hydrocarbon group having 6 to 20 carbon atoms represented by $R^5$ to $R^7$ include a phenyl group, a naphthyl group, and the like.

Examples of the divalent alicyclic hydrocarbon group having 4 to 12 carbon atoms that may be formed by $R^6$ and $R^7$ together with the carbon atom bonded to $R^6$ and $R^7$ include groups obtained by eliminating two hydrogen atoms from cycloalkanes (e.g., cyclobutanediyl group, cyclopentanediyl group, cyclohexanediyl group, dicyclopentanediyl group, norbornanediyl group, tricyclodecanediyl group, tetracyclododecanediyl group, and adamantanediyl group), and the like.

The structural unit (II) is preferably at least one structural unit selected from the group consisting of a structural unit shown by the formula (2-i), a structural unit shown by the formula (2-ii), and a structural unit shown by the formula (2-iii). When the photoresist composition includes the structural unit (II) that includes an acid-labile group that has a relatively small structure, the photoresist composition achieves more excellent CDU, smaller LWR, and more excellent cross-sectional shape rectangularity.

$R^{4a}$ and $R^{4b}$, and $R^{4c}$ in the formulas (2-i) to (2-iii) independently represent a hydrogen atom, a fluorine atom, a methyl group, or a trifluoromethyl group.

$R^{5a}$, $R^{6a}$, and $R^{7a}$ in the formula (2-i) independently represent a linear or branched alkyl group having 1 to 5 carbon atoms, provided that the total number of carbon atoms of the alkyl groups represented by $R^{5a}$, $R^{6a}$, and $R^{7a}$ is 7 or less.

$R^{5b}$ and $R^{7b}$ in the formula (2-ii) independently represent a linear or branched alkyl group having 1 to 3 carbon atoms, and m is an integer from 1 to 4.

$R^{5c}$ in the formula (2-iii) represents a linear or branched alkyl group having 1 to 4 carbon atoms, and n is an integer from 1 to 4.

m is preferably 1 or 2, and more preferably 1. n is preferably 1, 2, or 4, more preferably 1 or 2, and still more preferably 1.

The structural unit (II) is preferably a structural unit shown by a formula (2-3), more preferably a structural unit derived from a 1-alkyl-1-cyclopentyl(meth)acrylate, and still more preferably a structural unit derived from 1-methyl-1-cyclopentyl(meth)acrylate or a structural unit derived from 1-isopropyl-1-cyclopentyl(meth)acrylate.

Examples of the structural unit (II) include structural units shown by the following formulas (2-1) and (2-23), and the like.

(2-1) 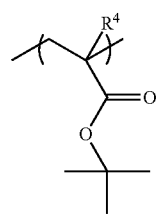
(2-2) 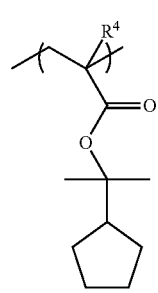
(2-3) 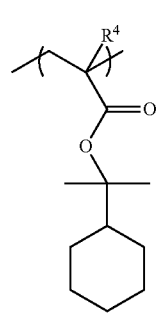
(2-4) 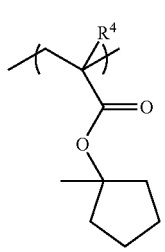
(2-5) 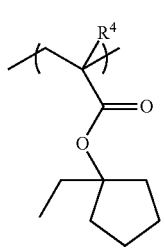
(2-6) 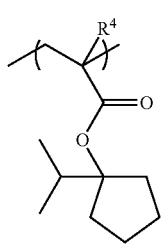
-continued
(2-7) 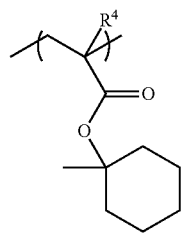
(2-8) 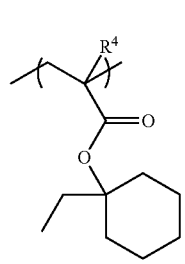
(2-9) 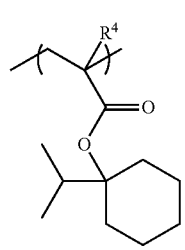
(2-10) 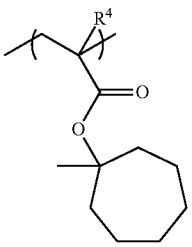
(2-11) 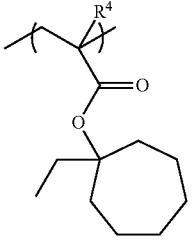
(2-12) 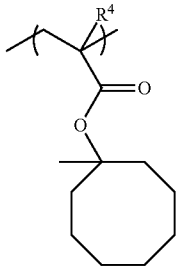

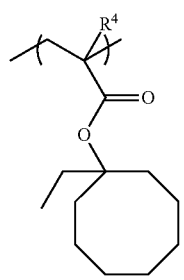 (2-13)
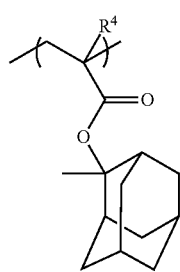 (2-14)
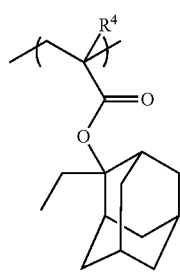 (2-15)
(2-16)
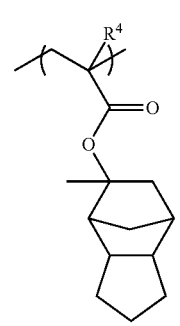 (2-17)
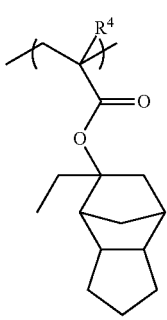 (2-18)
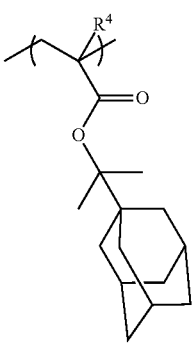 (2-19)
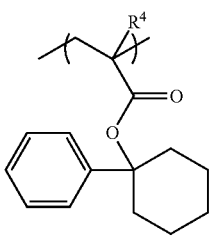 (2-20)
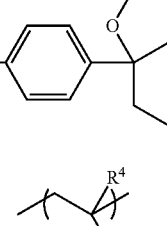 (2-21)
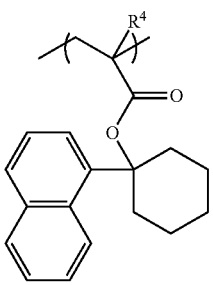 (2-22)

-continued (2-23)
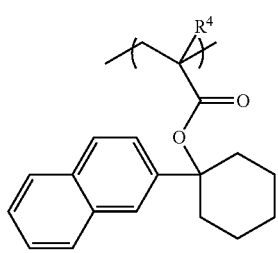

wherein R⁴ is the same as defined for the formula (2).

Among these, the structural units shown by the formulas (2-1) to (2-19) are preferable, the structural units shown by the formulas (2-1) to (2-16) and (2-19) are more preferable, the structural units shown by the formulas (2-1) to (2-16) are more preferable, the structural units shown by the formulas (2-1) to (2-13) are still more preferable, and the structural units shown by the formulas (2-4) and (2-6) are particularly preferable.

Examples of a monomer that produces the structural unit (II) include a monomer that includes a chain-like acid-labile group (e.g., t-alkyl ester), a monomer that includes an acid-labile group that includes a monoalicyclic group (e.g., 1-alkyl-1-cycloalkyl ester and cycloalkyl group-substituted alkyl ester), a monomer that includes an acid-labile group that includes a polyalicyclic group (e.g., 2-alkyl-2-bicycloalkyl ester and bicycloalkyl group-substituted alkyl ester), and the like.

The content of the structural unit (II) in the polymer (A) is preferably 10 to 80 mol %, more preferably 20 to 75 mol %, and still more preferably 30 to 70 mol %. When the content of the structural unit (II) is within the above range, the resulting resist pattern exhibits improved lithographic performance.

Structural Unit (III)

The structural unit (III) is a structural unit that includes at least one group selected from the group consisting of a lactone group, a cyclic carbonate group, and a sultone group (excluding the structural unit (I)). When the polymer (A) includes the structural unit (III), a resist film formed using the photoresist composition exhibits improved adhesion.

Examples of the structural unit (III) include structural units shown by the following formulas, and the like.

-continued

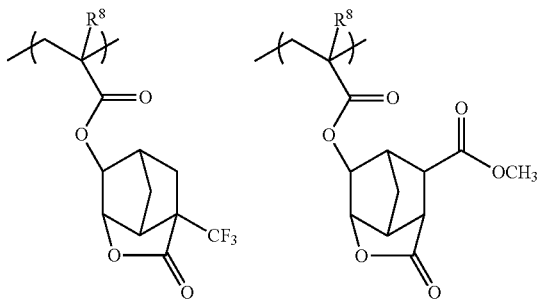

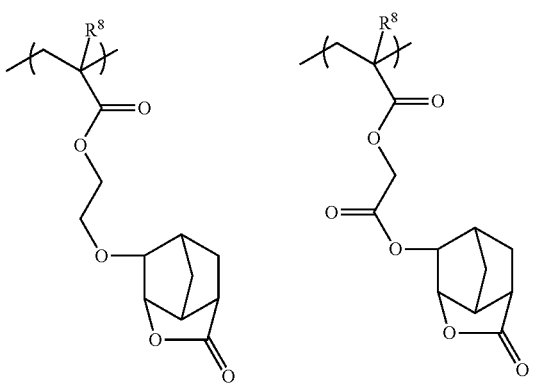

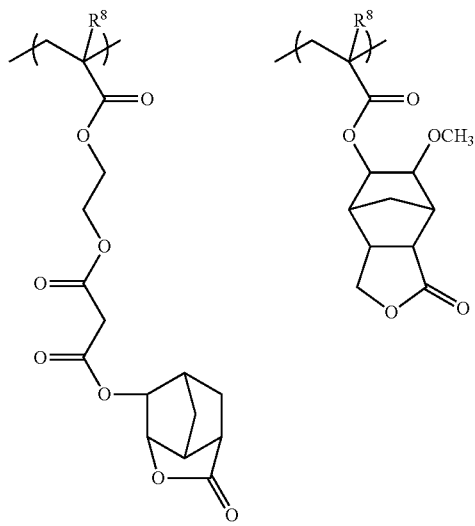

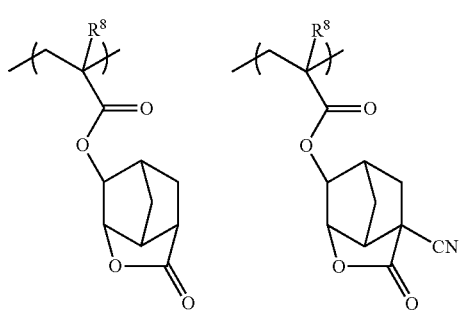

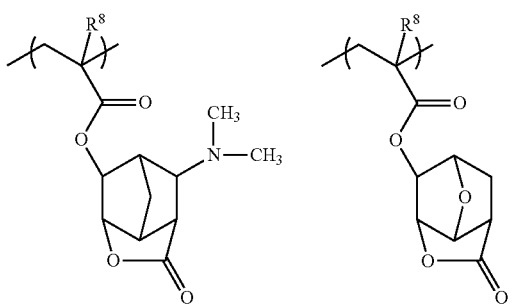

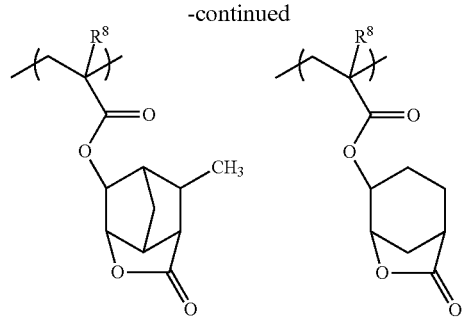
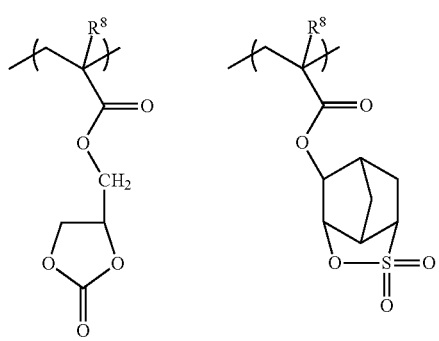
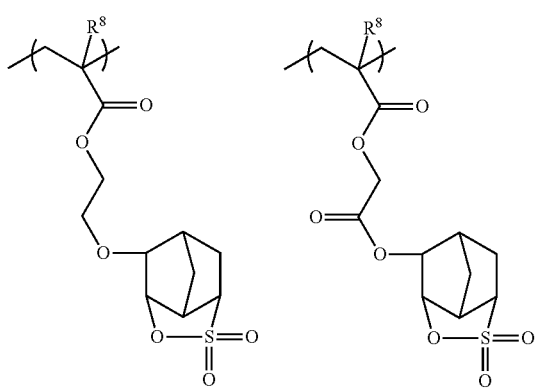
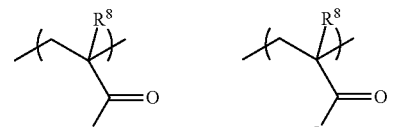
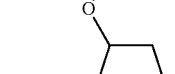
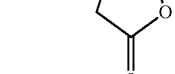
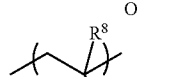
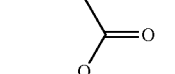
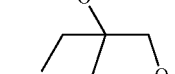
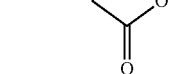

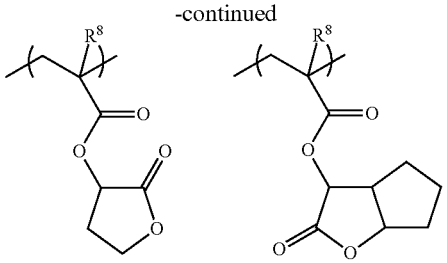
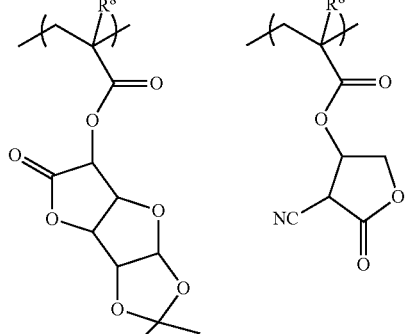
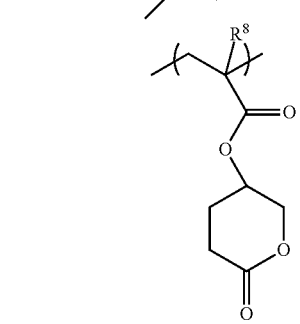

wherein $R^8$ represents a hydrogen atom, a fluorine atom, a methyl group, or a trifluoromethyl group.

The structural unit (III) is preferably a structural unit that includes a lactone group, more preferably a structural unit that includes a norbornanelactone structure, still more preferably a structural unit that includes a norbornanelactone group or a structural unit that includes a methoxycarbonyl group-substituted norbornanelactone group, and particularly preferably a structural unit that includes a methoxycarbonyl group-substituted norbornanelactone group.

Examples of a monomer that produces the structural unit (III) include the compounds shown by the following formulas, and the like.

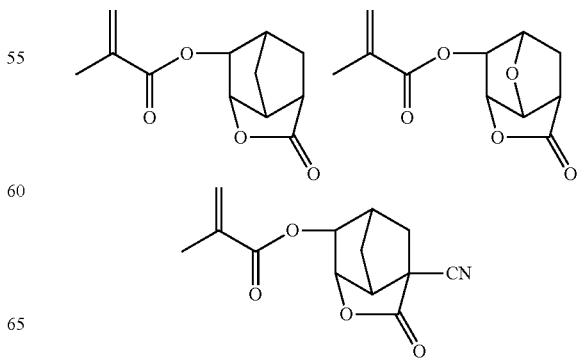

-continued

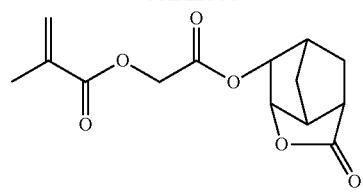
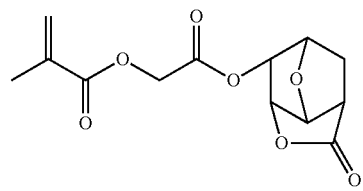
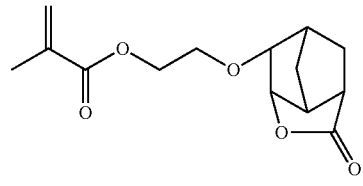
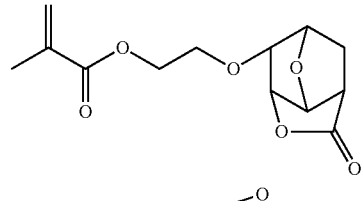
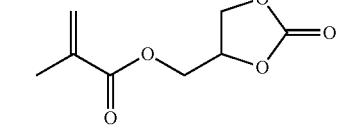
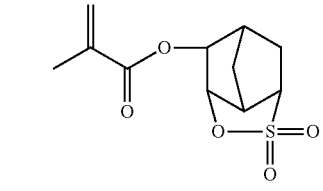
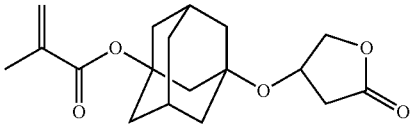
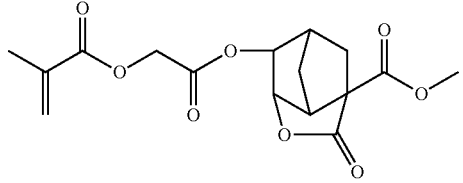
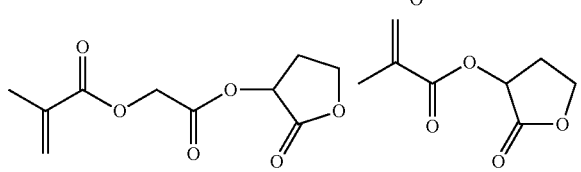
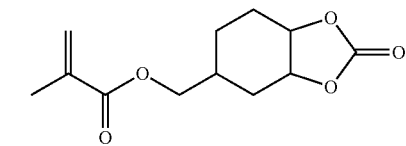

-continued

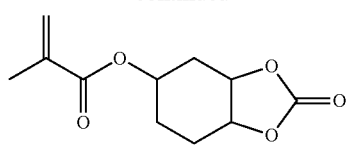

The content of the structural unit (III) in the polymer (A) is preferably 10 to 80 mol %, more preferably 15 to 70 mol %, and still more preferably 20 to 60 mol %. When the content of the structural unit (III) is within the above range, a resist film formed using the photoresist composition exhibits improved adhesion to a substrate or the like.

Additional Structural Unit

Structural Unit (IV)

The polymer (A) may include a structural unit (IV) that includes a hydrophilic functional group or the like as an additional structural unit other than the structural units (I) to (III). It is conjectured that diffusion of the acid generated by the acid generator (B) can be more appropriately controlled when the polymer (A) includes the structural unit (IV) that includes a hydrophilic functional group, so that the photoresist composition exhibits improved lithographic performance (e.g., CDU, LWR, and cross-sectional shape rectangularity).

Examples of the hydrophilic functional group include a hydroxyl group, a carboxyl group, a carbonyl group, a β-diketone group, a sulfonamide group, and the like. Among these, a hydroxyl group is preferable.

Examples of the structural unit (IV) include structural units shown by the following formulas, and the like.

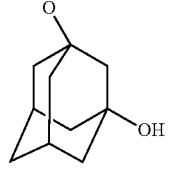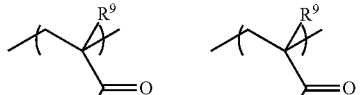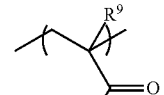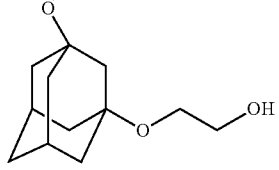

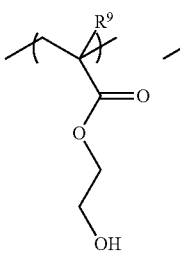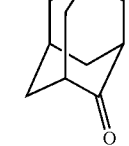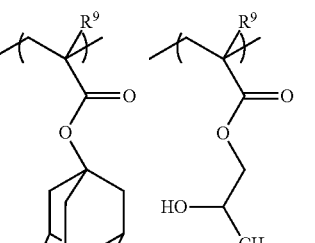

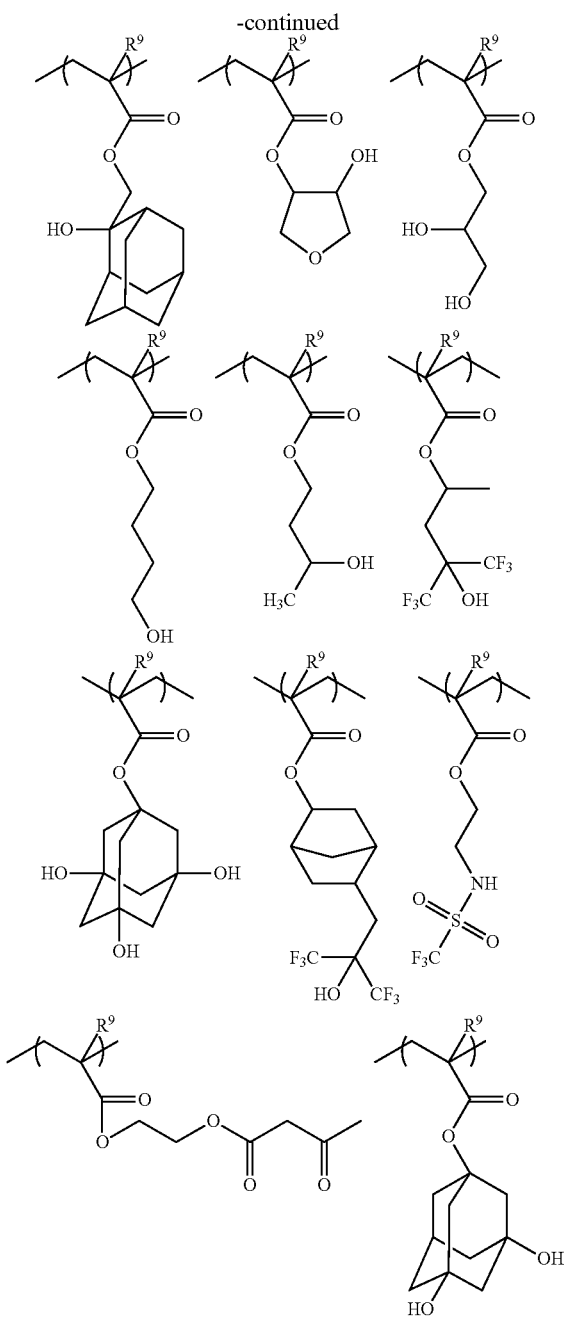

wherein R⁹ represents a hydrogen atom, a fluorine atom, a methyl group, or a trifluoromethyl group.

Among these, a structural unit derived from 3-hydroxyadamantan-1-yl(meth)acrylate and a structural unit derived from 3,5-dihydroxyadamantan-1-yl(meth)acrylate are preferable, and a structural unit derived from 3,5-dihydroxyadamantan-1-yl(meth)acrylate is more preferable.

The content of the structural unit (IV) in the polymer (A) is preferably 0 to 30 mol %, and more preferably 5 to 20 mol %.

Synthesis of Polymer (A)

The polymer (A) may be produced by polymerizing a monomer that produces each structural unit in an appropriate solvent using a radical initiator, for example. The polymer (A) is preferably produced by adding a solution containing a monomer and a radical initiator dropwise to a reaction solvent or a solution containing a monomer to effect polymerization, or adding a solution containing a monomer and a solution containing a radical initiator dropwise to a reaction solvent or a solution containing a monomer to effect polymerization, or adding a plurality of solutions containing a different monomer and a solution containing a radical initiator dropwise to a reaction solvent or a solution containing a monomer to effect polymerization, for example.

The reaction temperature may be appropriately determined depending on the type of initiator. The reaction temperature is normally 30 to 180° C., preferably 40 to 160° C., and more preferably 50 to 140° C. The dropwise addition time is determined depending on the reaction temperature, the type of initiator, the type of monomer, and the like, but is normally 30 minutes to 8 hours, preferably 45 minutes to 6 hours, and more preferably 1 to 5 hours.

The total reaction time including the dropwise addition time is also determined depending on the reaction conditions, but is normally 30 minutes to 10 hours, preferably 45 minutes to 9 hours, and more preferably 1 to 8 hours.

Examples of the radical initiator used for polymerization include azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2-methylpropionitrile), and the like. These initiators may be used either alone or in combination.

The polymerization solvent is not particularly limited as long as the polymerization solvent does not hinder polymerization (e.g., nitrobenzene has a polymerization inhibiting effect, and a mercapto compound has a chain transfer effect, which are undesirable) and can dissolve the monomer. Examples of the polymerization solvent include alcohol solvents, ketone solvents, amide solvents, ester/lactone solvents, nitrile solvents, mixed solvents thereof, and the like. These solvents may be used either alone or in combination.

The polymer obtained by polymerization is preferably collected by re-precipitation. Specifically, the polymer solution is poured into a re-precipitation solvent after completion of polymerization to collect the target polymer as a powder. An alcohol, an alkane, or the like may be used as the re-precipitation solvent either alone or in combination. The polymer may also be collected by removing low-molecular-weight components (e.g., monomer and oligomer) by a separation operation, a column operation, ultrafiltration, or the like.

The polystyrene-reduced weight average molecular weight (Mw) of the polymer (A) determined by gel permeation chromatography (GPC) is normally 2000 to 30,000, preferably 3000 to 8000, more preferably 3500 to 7500, and still more preferably 4000 to 7000. When the Mw of the polymer (A) is within the above range, the photoresist composition exhibits improved lithographic performance (e.g., CDU, LWR, and cross-sectional shape rectangularity).

The ratio (Mw/Mn) of the Mw to the polystyrene-reduced number average molecular weight (Mn) of the polymer (A) determined by GPC is normally 1 to 5, preferably 1 to 3, and more preferably 1 to 2.5. When the ratio (Mw/Mn) of the polymer (A) is within the above range, the resulting photoresist film exhibits excellent resolution.

Note that the terms "Mw" and "Mn" used herein refer to values measured by gel permeation chromatography (GPC) using GPC columns (manufactured by Tosoh Corporation, G2000HXL×2, G3000HXL×1, G4000HXL×1) at a flow rate of 1.0 ml/min and a column temperature of 40° C. (eluant: tetrahydrofuran, standard: monodisperse polystyrene).

Acid Generator (B)

The acid generator (B) is a compound that generates an acid upon exposure to radiation via a mask in an exposure step of a resist pattern-forming method. The acid generator (B)

may be included in the photoresist composition as a compound (described below) and/or may be included in the polymer.

Examples of the acid generator (B) include onium salt compounds, N-sulfonyloxyimide compounds, halogen-containing compounds, diazoketone compounds, and the like. Among these, onium salt compounds are preferable.

Examples of the onium salt compounds include sulfonium salts, tetrahydrothiophenium salts, iodonium salts, phosphonium salts, diazonium salts, pyridinium salts, and the like. Among these, sulfonium salts, tetrahydrothiophenium salts, and iodonium salts are preferable.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoro ethane sulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylsulfonium 4-(1-adamantanecarbonyloxy)-1,1,2,2-tetrafluorobutanesulfonate, triphenylphosphonium 1,1,2,2-tetrafluoro-6-(1-adamantanecarbonyloxy)hexane-1-sulfonate, and the like. Among these, triphenylsulfonium trifluoromethanesulfonate, triphenylsulfonium nonafluoro-n-butanesulfonate, triphenylsulfonium 4-(1-adamantanecarbonyloxy)-1,1,2,2-tetrafluorobutanesulfonate, and triphenylphosphonium 1,1,2,2-tetrafluoro-6-(1-adamantanecarbonyloxy)hexane-1-sulfonate are preferable, and triphenylphosphonium 1,1,2,2-tetrafluoro-6-(1-adamantanecarbonyloxy)hexane-1-sulfonate is more preferable.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethane sulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethane sulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like. Among these, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, and 1-(3,5-dimethyl-4-hydroxyphenyl)tetrahydrothiophenium nonafluoro-n-butanesulfonate are preferable.

Examples of the iodonium salts include diphenyliodonium trifluoromethanesulfonate, diphenyliodonium nona fluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like. Among these, bis(4-t-butylphenyl)iodonium nonafluoro-n-butanesulfonate is preferable.

It is preferable that the acid generator (B) have an alicyclic structure having 8 to 30 carbon atoms.

When the acid generator (B) has a bulky alicyclic structure, diffusion of the acid generated upon exposure can be more appropriately controlled. The photoresist composition that includes the acid generator (B) together with the polymer (A) achieves excellent CDU, small LWR, and excellent cross-sectional shape rectangularity.

A compound shown by the following formula (3) is preferable as the acid generator (B) that has an alicyclic structure having 8 to 30 carbon atoms. In this case, the anion that forms the compound has an alicyclic structure having 8 to 30 carbon atoms.

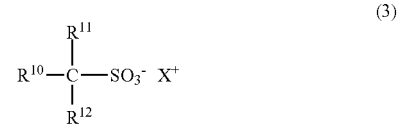

(3)

wherein $X^+$ represents an onium cation, $R^{10}$ represents a monovalent organic group that includes an alicyclic structure having 8 to 30 carbon atoms, and $R^{11}$ and $R^{12}$ represent a hydrogen atom, a fluorine atom, or a chain-like hydrocarbon group having 1 to 20 carbon atoms, provided that some or all of the hydrogen atoms of the chain-like hydrocarbon group may be substituted with a fluorine atom, and at least one of $R^{11}$ and $R^{12}$ represents a fluorine atom or a perfluoroalkyl group.

Examples of the monovalent organic group represented by $R^{10}$ that includes an alicyclic structure having 8 to 30 carbon atoms include alicyclic hydrocarbon groups having 8 to 30 carbon atoms, groups formed by combining at least one group selected from the group consisting of —CO—O—, —O—CO—O—, —O—, —SO$_2$—, —CO—NH—, —SO$_2$NH—, —O—CO—, and chain-like hydrocarbon groups having 1 to 20 carbon atoms with an alicyclic hydrocarbon group having 8 to 30 carbon atoms, and the like.

Examples of the alicyclic hydrocarbon groups having 8 to 30 carbon atoms include a cyclooctyl group, a cyclodecyl group, a cyclododecyl group, a cyclopentadecyl group, a cyclononadecyl group, an adamantyl group, a diamantyl group, and the like.

Examples of the chain-like hydrocarbon group having 1 to 20 carbon atoms represented by $R^{11}$ and $R^{12}$ include a methyl group, an ethyl group, a propyl group, a butyl group, a pentyl group, a hexyl group, and the like. Among these, a methyl group, an ethyl group, and a propyl group are preferable.

$R^{11}$ and $R^{12}$ preferably represent a fluorine atom, a trifluoromethyl group, or a perfluoroethyl group.

Examples of the acid generator (B) shown by the formula (3) include triphenylsulfonium 4-(1-adamantanecarbonyloxy)-1,1,2,2-tetrafluorobutanesulfonate, triphenylphosphonium 1,1,2,2-tetrafluoro-6-(1-adamantanecarbonyloxy)hexane-1-sulfonate, triphenylsulfonium 2-(adamantan-1-yl)-1,1-difluoroethane-1-sulfonate, and the like. Among these, triphenylsulfonium 4-(1-adamantanecarbonyloxy)-1,1,2,2-tetrafluorobutanesulfonate and triphenylphosphonium 1,1,2,2-tetrafluoro-6-(1-adamantanecarbonyloxy)hexane-1-sulfonate are preferable, and triphenylphosphonium 1,1,2,2-tetrafluoro-6-(1-adamantanecarbonyloxy)hexane-1-sulfonate is more preferable.

These acid generators (B) may be used either alone or in combination. The acid generator (B) is preferably used in an amount of 0.01 to 35 parts by mass, more preferably 0.1 to 30 parts by mass, still more preferably 0.5 to 20 parts by mass, and particularly preferably 1 to 15 parts by mass, based on 100 parts by mass of the polymer (A), in order to ensure that a resist film formed using the photoresist composition exhibits sufficient sensitivity and developability.

Water-Repellent Polymer Additive (C)

The photoresist composition preferably includes the water-repellent polymer additive (C) that includes a fluorine atom. When the photoresist composition includes the water-repellent polymer additive (C), the water-repellent polymer additive (C) tends to be unevenly distributed in the surface area of a resist film formed using the photoresist composition due to the water repellency of the water-repellent polymer additive (C), so that elution of the acid generator, the acid diffusion controller, and the like into an immersion medium during liquid immersion lithography can be suppressed. It is also possible to control the advancing contact angle of the resist film with the immersion medium within the desired range due to the water repellency of the water-repellent polymer additive (C), so that bubble defects can be suppressed. Moreover, since the receding contact angle of the resist film with the immersion medium increases, it is possible to implement high-speed scan exposure (i.e., water droplets do not remain). A resist film suitable for liquid immersion lithography can be formed by incorporating the water-repellent polymer additive (C) in the photoresist composition.

It is preferable that the water-repellent polymer additive (C) have a fluorine atom content (mass %) higher than that of the polymer (A). The degree of uneven distribution increases when the water-repellent polymer additive (C) has a fluorine atom content higher than that of the polymer (A), so that the properties (e.g., water repellency and elution resistance) of the resulting resist film are improved.

The water-repellent polymer additive (C) is produced by polymerizing one or more monomers that include a fluorine atom in its structure.

Examples of the monomer that produces a polymer that includes a fluorine atom in its structure include monomers that include a fluorine atom in the main chain, monomers that include a fluorine atom in the side chain, and monomers that include a fluorine atom in the main chain and the side chain.

Examples of the monomers that produce a polymer that includes a fluorine atom in the main chain include α-fluoroacrylate compounds, α-trifluoromethyl acrylate compounds, β-fluoroacrylate compounds, β-trifluoromethyl acrylate compounds, α,β-fluoroacrylate compounds, α,β-trifluoromethyl acrylate compounds, compounds in which a hydrogen atom of at least one vinyl site is substituted with a fluorine atom, a trifluoromethyl group, or the like, and the like.

Examples of the monomers that produce a polymer that includes a fluorine atom in the side chain include compounds obtained by substituting the side chain of an alicyclic olefin compound (e.g., norbornene) with a fluorine atom, a fluoroalkyl group, or a group derived therefrom, fluoroalkyl acrylates, fluoroalkyl methacrylates, derivatives thereof, compounds obtained by substituting the side chain (i.e., a site that does not include a double bond) of an olefin with a fluorine atom, a fluoroalkyl group, or a group derived therefrom, and the like.

Examples of the monomers that produce a polymer that includes a fluorine atom in the main chain and the side chain include ester compounds of α-fluoroacrylic acid, β-fluoroacrylic acid, α,β-fluoroacrylic acid, α-trifluoromethylacrylic acid, β-trifluoromethylacrylic acid, α,β-trifluoromethylacrylic acid, and the like, compounds obtained by substituting a fluorine atom, a fluoroalkyl group, or a group derived therefrom into the side chain of a compound in which a hydrogen atom of at least one vinyl site is substituted with a fluorine atom, a trifluoromethyl group, or the like, compounds obtained by substituting a hydrogen atom bonded to the double bond of an alicyclic olefin compound with a fluorine atom, a trifluoromethyl group, or the like, and substituting the side chain of the alicyclic olefin compound with a fluoroalkyl group or a group derived therefrom, and the like. Note that the term "alicyclic olefin compound" used herein refers to a compound that includes a double bond in its ring structure.

Examples of a structural unit included in the water-repellent polymer additive (C) include a structural unit shown by the following formula (hereinafter may be referred to as "structural unit (V)").

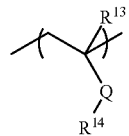

wherein $R^{13}$ represents a hydrogen atom, a methyl group, or a trifluoromethyl group, Q represents a linking group, and $R^{14}$ represents a linear or branched alkyl group having 1 to 6 carbon atoms that is substituted with at least one fluorine atom, or a monovalent alicyclic hydrocarbon group having 4 to 20 carbon atoms that is substituted with at least one fluorine atom, or a group derived therefrom.

Examples of the linking group represented by Q include a single bond, an oxygen atom, a sulfur atom, a carbonyloxy group, an oxycarbonyl group, an amide group, a sulfonylamide group, a urethane group, and the like.

Examples of a monomer that produces the structural unit (V) include 2-[1-(ethoxycarbonyl)-1,1-difluorobutyl](meth)acrylate, trifluoromethyl(meth)acrylate, 2,2,2-trifluoroethyl(meth)acrylate, perfluoroethyl(meth)acrylate, perfluoro-n-propyl (meth)acrylate, perfluoro-i-propyl(meth)acrylate, perfluoro-n-butyl(meth)acrylate, perfluoro-i-butyl(meth)acrylate, perfluoro-t-butyl(meth)acrylate, 2-(1,1,1,3,3,3-hexafluoropropyl)(meth)acrylate, 1-(2,2,3,3,4,4,5,5-octafluoropentyl)(meth)acrylate, perfluorocyclohexylmethyl(meth)acrylate, 1-(2,2,3,3,3-pentafluoropropyl)(meth)acrylate, 1-(3,3,4,4,5,5,6,6,7,7,8,8,9,9,10,10,10-heptadecafluorodecyl)(meth)acrylate, 1-(5-trifluoromethyl-3,3,4,4,5,6,6,6-octafluorohexyl)(meth)acrylate, and the like.

The water-repellent polymer additive (C) may include only one type of the structural unit (V), or may include two or more types of the structural unit (V). The content of the structural unit (V) in the water-repellent polymer additive (C) is normally 5 mol % or more, preferably 10 mol % or more, and more preferably 15 mol % or more. When the content of the structural unit (V) is within the above range, a high receding contact angle can be achieved, and elution of the acid generator and the like from the resist film can be suppressed.

The water-repellent polymer additive (C) may further include one or more additional structural units such as a structural unit that includes an acid-labile group, a structural unit that includes at least one group selected from the group consisting of a lactone group, a cyclic carbonate group, and a sultone group, and a structural unit that includes a hydrophilic functional group (e.g., hydroxyl group or carboxyl group), in order to control the dissolution rate in a developer.

Examples of the additional structural unit that includes an acid-labile group include the structural units mentioned above in connection with the structural unit (II). Examples of the additional structural unit that includes at least one group selected from the group consisting of a lactone group, a cyclic carbonate group, and a sultone group include the structural units mentioned above in connection with the structural unit (III). Examples of the additional structural unit that includes a hydrophilic functional group include the structural units mentioned above in connection with the structural unit (IV).

The content of the additional structural unit in the water-repellent polymer additive (C) is normally 80 mol % or less, preferably 75 mol % or less, and more preferably 70 mol % or less, based on the total structural units included in the water-repellent polymer additive (C).

The Mw of the water-repellent polymer additive (C) is preferably 1000 to 100,000, more preferably 2000 to 50,000, and particularly preferably 3000 to 30,000.

When the Mw of the water-repellent polymer additive (C) is within the above range, a high receding contact angle can be achieved, and elution of the acid generator and the like from the resist film can be efficiently suppressed. The ratio (Mw/Mn) of the Mw to the Mn of the water-repellent polymer additive (C) is normally 1 to 3, and preferably 1 to 2.5.

The water-repellent polymer additive (C) is preferably used in an amount of 0 to 50 parts by mass, more preferably 0 to 20 parts by mass, particularly preferably 0.5 to 10 parts by mass, and most preferably 1 to 8 parts by mass, based on 100 parts by mass of the polymer (A). When the amount of the water-repellent polymer additive (C) is within the above range, the water repellency and the elution resistance of the surface of the resulting resist film can be improved.

Synthesis of Water-Repellent Polymer Additive (C)

The water-repellent polymer additive (C) may be synthesized by polymerizing a monomer that produces each structural unit in an appropriate solvent using a radical initiator, for example.

Examples of the radical initiator and the solvent used for polymerization include those mentioned above in connection with synthesis of the polymer (A).

The reaction (polymerization) temperature is normally 40 to 150° C., and preferably 50 to 120° C. The reaction time is normally 1 to 48 hours, and preferably 1 to 24 hours.

Acid Diffusion Controller (D)

The acid diffusion controller (D) controls a phenomenon in which the acid generated by the acid generator (B) upon exposure is diffused in the resist film, and suppresses undesired chemical reactions in the unexposed area. When the photoresist composition includes the acid diffusion controller (D), the storage stability of the photoresist composition and the resolution of the resulting resist are further improved. The acid diffusion controller (D) also suppresses a change in line width of the resist pattern due to a change in post-exposure delay, so that a composition that exhibits remarkably superior process stability can be obtained. Note that the acid diffusion controller (D) may be included in the photoresist composition as a free compound, or may be included in the polymer.

Examples of the acid diffusion controller (D) include amine compounds, amide group-containing compounds, urea compounds, nitrogen-containing heterocyclic compounds, and the like.

Examples of the amine compounds include mono(cyclo)alkylamines, di(cyclo)alkylamines, tri(cyclo)alkylamines, substituted-alkylaniline or derivatives thereof, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, triethanolamine, and the like.

Examples of the amide group-containing compounds include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles, pyridines, piperazines, pyrazine, pyrazole, pyridazine, quinoxaline, purine, pyrrolidine, piperidine, 4-hydroxy-N-amyloxycarbonylpiperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, N-t-amyloxycarbonyl-4-hydroxypiperidine, and the like.

Among these, N-t-amyloxycarbonyl-4-hydroxypiperidine is preferable.

A photodegradable base that generates a weak acid upon exposure may also be used as the acid diffusion controller (D). The photodegradable base generates an acid in the exposed area, and increases the insolubility of the polymer (A) in a developer, so that roughness of the surface of the exposed area after development is suppressed. The photodegradable base functions as a quencher that captures an acid due to an anion in the unexposed area, and captures an acid diffused from the exposed area. Specifically, since the photodegradable base functions as a quencher only in the unexposed area, the contrast of the deprotection reaction is improved, so that the resolution can be further improved. Examples of the photodegradable base include onium salt compounds that lose acid-diffusion controllability upon decomposition due to exposure. Examples of the onium salt compounds include a sulfonium salt compound shown by the following formula (D1), an iodonium salt compound shown by the following formula (D2), and the like.

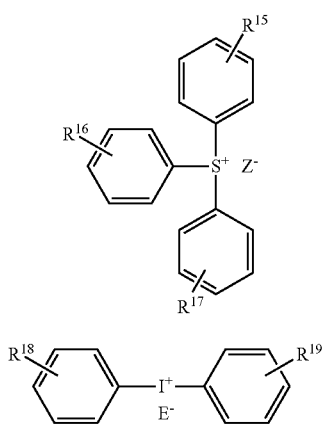

wherein $R^{15}$ to $R^{19}$ independently represent a hydrogen atom, an alkyl group, an alkoxyl group, a hydroxyl group, a halogen atom, or $-SO_2-R^C$, $R^C$ represents an alkyl group, a cycloalkyl group, an alkoxy group, or an aryl group, $Z^-$ and $E^-$ represent $OH^-$, $R^{20}-COO^-$, $R^D-SO_2-N^--R^{20}$, $R^{20}-SO_3^-$, or an anion shown by the following formula (D3), $R^{20}$ represents a linear or branched alkyl group having 1 to 10 carbon atoms, a cycloalkyl group having 3 to 20 carbon atoms, an aryl group having 6 to 30 carbon atoms, or an alkaryl group having 7 to 30 carbon atoms, provided some or all of the hydrogen atoms of the alkyl group, the cycloalkyl group, the aryl group, or the alkaryl group may be substituted with a substituent, and $R^D$ represents a linear or branched alkyl group having 1 to 10 carbon atoms or a substituted or unsubstituted cycloalkyl group having 3 to 20 carbon atoms, provided some or all of the hydrogen atoms of the alkyl group or the cycloalkyl group may be substituted with a fluorine atom, and a fluorine atom is not bonded to the carbon atom bonded to $SO_3^-$ when $Z^-$ or $E^-$ represents $R^{20}-SO_3^-$.

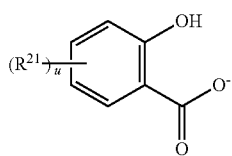

wherein $R^{21}$ represents a linear or branched alkyl group having 1 to 12 carbon atoms wherein some or all of the hydrogen atoms may be substituted with a fluorine atom, or a linear or branched alkoxy group having 1 to 12 carbon atoms, and u is an integer from 0 to 2.

The acid diffusion controller (D) is preferably added to the photoresist composition used for the pattern-forming method in an amount of less than 20 parts by mass, and more preferably less than 10 parts by mass, based on 100 parts by mass of the polymer (A). When the amount of the acid diffusion controller (D) is within the above range, the photoresist composition can achieve improved CDU, small LWR, and improved cross-sectional shape rectangularity while maintaining sensitivity. These acid diffusion controllers (D) may be used either alone or in combination.

Solvent (E)

The photoresist composition normally includes the solvent (E). Examples of the solvent (E) include alcohol solvents, ether solvents, ketone solvents, amide solvents, ester solvents, hydrocarbon solvents, a mixed solvent thereof, and the like.

Examples of the alcohol solvents include monohydric alcohol solvents such as methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like.

Examples of the ether solvents include dialkyl ether solvents such as diethyl ether, dipropyl ether, and dibutyl ether; aromatic ring-containing ether solvents such as diphenyl ether and anisole; and the like.

Examples of the ketone solvents include chain-like ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, and trimethylenonane; cyclic ketone solvents such as cyclopentanone, cyclohexanone, cycloheptanone, cyclooctanone, and methylcyclohexanone; 2,4-pentanedione; acetonylacetone; acetophenone; and the like.

Examples of the amide solvents include cyclic amide solvents such as N,N'-dimethylimidazolidinone and N-methylpyrrolidone; chain-like amide solvents such as N-methylformamide, N,N-dimethylformamide, N,N-dimethylformamide, acetamide, N-methylacetamide, N,N-dimethylacetamide, and N-methylpropioneamide; and the like.

Examples of the ester solvents include carbonate solvents such as diethyl carbonate and propylene carbonate; lactone solvents such as γ-butyrolactone and γ-valerolactone; acetate solvents such as methyl acetate, ethyl acetate, n-propyl acetate, i-propyl acetate, n-butyl acetate, i-butyl acetate, s-butyl acetate, n-pentyl acetate, s-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, and ethyl acetoacetate; polyhydric alcohol partial ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, and dipropylene glycol monomethyl ether acetate; glycol diacetate; methoxy triglycol acetate; ethyl propionate; n-butyl propionate; i-amyl propionate; diethyl oxalate; di-n-butyl oxalate; methyl lactate; ethyl lactate; n-butyl lactate; n-amyl lactate; diethyl malonate; dimethyl phthalate; diethyl phthalate; and the like.

Examples of the hydrocarbon solvents include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, mesitylene, ethylbenzene, trimethylbenzene, methylethylbenzene, n-propylbenzene, i-propylbenzene, diethylbenzene, i-butylbenzene, triethylbenzene, diisopropylbenzene, and n-amylnaphthalene; and the like.

The solvent (E) is preferably an ester solvent or a ketone solvent, more preferably a polyhydric alcohol partial ether acetate solvent, a lactone solvent, or a cyclic ketone solvent, and still more preferably propylene glycol monomethyl ether acetate, γ-butyrolactone, or cyclohexanone. These solvents may be used either alone or in combination.

Additional Optional Component

The photoresist composition may include a surfactant, an alicyclic skeleton-containing compound, a sensitizer, or the like as an additional optional component. Note that the photoresist composition may include only one type of each additional optional component, or may include two or more types of each additional optional component.

Surfactant

The surfactant improves the applicability, striation resistance, developability, and the like of the photoresist composition. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like.

Alicyclic Skeleton-Containing Compound

The alicyclic skeleton-containing compound improves the dry etching resistance of the photoresist composition, the pattern shape, adhesion to a substrate, and the like.

Examples of the alicyclic skeleton-containing compound include adamantane derivatives such as 1-adamantanecarboxylic acid, 2-adamantanone, and t-butyl 1-adamantanecarboxylate; deoxycholates such as t-butyl deoxycholate, t-butoxycarbonylmethyl deoxycholate, and 2-ethoxyethyl deoxycholate; lithocholates such as t-butyl lithocholate, t-butoxycarbonylmethyl lithocholate, and 2-ethoxyethyl lithocholate; 3-[2-hydroxy-2,2-bis(trifluoromethyl)ethyl]tetracyclo[4.4.0.1$^{2,5}$. 1$^{7,10}$]dodecane; 2-hydroxy-9-methoxycarbonyl-5-oxo-4-oxa-tricyclo[4.2.1.0$^{3,7}$]nonane; and the like.

Sensitizer

The sensitizer increases the amount of acid generated by the acid generator (B), and improves the apparent sensitivity of the photoresist composition. Examples of the sensitizer include carbazoles, acetophenones, benzophenones, naphthalenes, phenols, biacetyl, eosine, rose bengal, pyrenes, anthracenes, phenothiazines, and the like.

Preparation of Photoresist Composition

The photoresist composition may be prepared by mixing the polymer (A), the acid generator (B), the water-repellent polymer additive (C), the acid diffusion controller (D), and an additional optional component in the solvent (E) in a given ratio, for example. The photoresist composition is used in a state in which the components are dissolved or dispersed in an appropriate solvent (E). The solid content in the photoresist composition is preferably 0.1 to 50 mass %, more preferably 0.3 to 30 mass %, still more preferably 0.5 to 20 mass %, and particularly preferably 1 to 10 mass %.

Resist Pattern-Forming Method

A resist pattern-forming method according to an embodiment of the invention includes (1) forming a resist film using the photoresist composition (hereinafter may be referred to as "step (1)"), (2) exposing the resist film (hereinafter may be referred to as "step (2)"), and (3) developing the exposed resist film (hereinafter may be referred to as "step (3)"). Each step is described in detail below.

The resist pattern-forming method can form a resist pattern that exhibits excellent CDU, small LWR, and excellent cross-sectional shape rectangularity by utilizing the photoresist composition.

Step (1)

In the step (1), the photoresist composition is applied to a substrate (e.g., a silicon wafer or a wafer coated with silicon dioxide and an antireflective film) to a given thickness by spin coating, cast coating, roll coating, or the like, and optionally prebaked (PB) at 70 to 160° C. to volatilize the solvent from the photoresist composition to form a resist film.

Step (2)

In the step (2), the resist film formed by the step (1) is exposed by applying radiation (optionally via an immersion medium (e.g., water)). In this case, radiation is applied via a mask having a given pattern. Radiation used for exposure is appropriately selected from visible rays, ultraviolet rays, deep ultraviolet rays, X-rays, charged particle rays, EUV light, and the like depending on the line width of the target pattern. It is preferable to use deep ultraviolet rays such as ArF excimer laser light (wavelength: 193 nm) or KrF excimer laser light (wavelength: 248 nm). Light that can form a finer pattern (e.g., EUV (extreme ultraviolet) light (wavelength: 13.5 nm) may also suitably be used. It is preferable to perform post-exposure bake (PEB) after exposure. PEB ensures smooth dissociation of the acid-labile group included in the polymer (A). The PEB temperature may be appropriately selected depending on the composition of the photoresist composition, but is normally about 50° C. to about 180° C.

Step (3)

In the step (3), the exposed resist film is developed using a developer to form a resist pattern. After development, the resist pattern is normally rinsed with a rinse agent, and dried. Examples of the developer include an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water, and the like. It is preferable to use a tetramethylammonium hydroxide (TMAH) aqueous solution. When developing the resist film using an organic solvent, one or more organic solvents among the organic solvents mentioned above in connection with the solvent (E) may be used. It is preferable to use a ketone solvent, an ester solvent, or an ether solvent, more preferably a chain-like ketone solvent, an acetate solvent, or an aromatic ring-containing ether solvent, still more preferably methyl n-pentyl ketone, n-butyl acetate, or anisole, and particularly preferably methyl n-pentyl ketone. As the rinse agent, water is normally used when developing the resist film using an alkaline aqueous solution, and an organic solvent (preferably an alcohol solvent) is normally used when developing the resist film using an organic solvent.

When performing liquid immersion lithography, a protective film that is insoluble in the immersion liquid may be formed on the resist film before performing the step (2) so that the immersion liquid does not come in direct contact with the resist film. A solvent removal-type protective film that is removed by a solvent prior to the step (3) (see Japanese Patent Application Publication (KOKAI) No. 2006-227632, for example), or a developer removal-type protective film that is removed during development in the step (3) (see WO2005-069076 and WO2006-035790, for example) may be used as the protective film.

EXAMPLES

The invention is further described below by way of examples. Note that the invention is not limited to the following examples. The polymer was subjected to $^{13}$C-NMR analysis using a mass spectrometer "JNM-EX270" (manufactured by JEOL Ltd.).

The structure of each monomer used to synthesize the polymer (A) and the water-repellent polymer additive (C) is shown below.

(M-1)
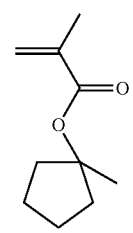

(M-2)
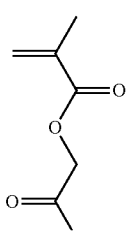

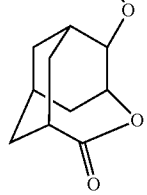

(M-3)
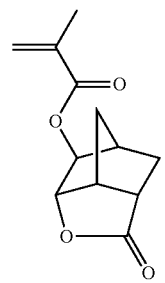

(M-4)
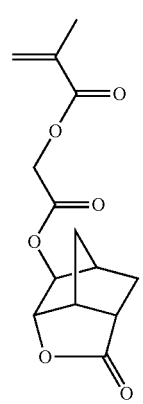

(M-5)
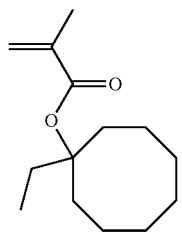

(M-6)
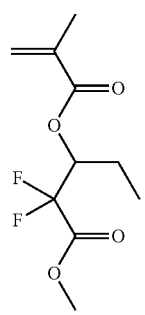

(M-7)
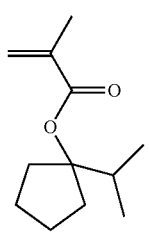

(M-8)
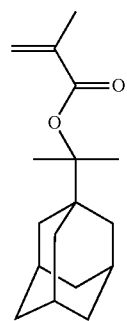
(M-9)
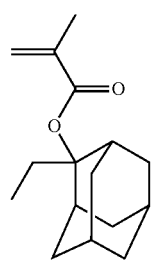
(M-10)
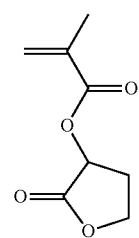
(M-11)
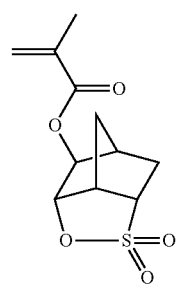
(M-12)
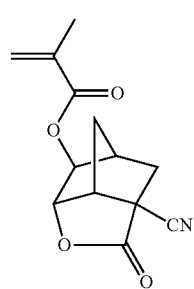
(M-13)
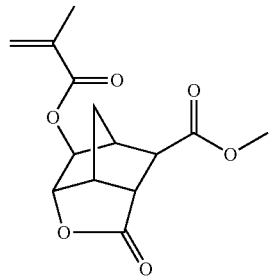
(M-14)
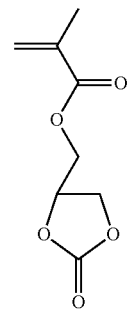
(M-15)
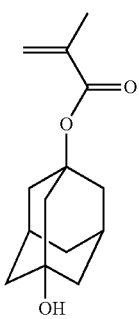
(M-16)
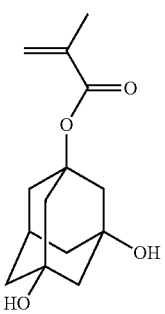
(M-17)
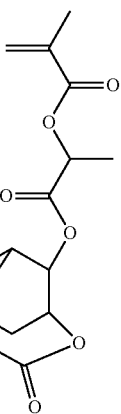

(M-18)

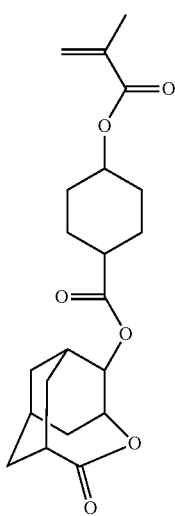

Note that the monomers (M-2), (M-17), and (M-18) produce the structural unit (I), the monomers (M-1), (M-5), (M-7), (M-8), and (M-9) produce the structural unit (II), the monomers (M-3), (M-4), (M-10), (M-11), (M-12), (M-13), and (M-14) produce the structural unit (III), and the monomers (M-15) and (M-16) produce the structural unit (IV).

Synthesis of Polymer (A)

Synthesis Example 1

A monomer solution was prepared by dissolving 41.26 g (50 mol %) of the compound (M-1) that produces the structural unit (II), 15.13 g (10 mol %) of compound (M-2) that produces the structural unit (I), and 43.61 g (40 mol %) of compound (M-3) that produces the structural unit (III) in 200 g of 2-butanone, and adding 4.03 g (5 mol % based on the total number of moles of the monomer compounds) of AIBN to the solution. A three-necked flask (1000 ml) charged with 100 g of 2-butanone was purged with nitrogen for 30 minutes, and heated to 80° C. with stirring. The monomer solution was added dropwise to the flask over 3 hours using a dropping funnel. The monomers were polymerized for 6 hours from the start of dropwise addition of the monomer solution. After completion of polymerization, the polymer solution was cooled with water to 30° C. or less, and poured into a mixture of 1600 g of methanol and 400 g of water. A white powder that precipitated by this operation was filtered off. The white powder was dispersed in (washed with) 400 g of methanol, and filtered off. This operation was repeated once. The white powder was then dried at 50° C. for 17 hours to obtain a white powdery polymer (A-1). The polymer (A-1) had an Mw of 5100 and a dispersity (Mw/Mn) of 1.34. The ratio of structural units derived from the compounds (M-1), (M-2), and (M-3) in the polymer (A-1) as determined by $^{13}$C-NMR analysis was 48.0:10.0:42.0 (mol %).

Synthesis Examples 2 to 14

Polymers (A-2) to (A-12), (a-1), and (a-2) were obtained in the same manner as in Synthesis Example 1, except that the types and the amounts of the monomers were changed as shown in Table 1. The content of each structural unit in each polymer, and the Mw and the dispersity (Mw/Mn) of each polymer are also shown in Table 1. Note that the symbol "-" in Table 1 indicates that the corresponding monomer was not used.

TABLE 1

| | | Structural unit (I) | | Structural unit (II) | | Structural unit (III) | | Structural unit (IV) | |
|---|---|---|---|---|---|---|---|---|---|
| | Polymer (A) | Monomer | Amount (mol %) | Monomer | Amount (mol %) | Monomer | Amount (mol %) | Monomer | Amount (mol %) |
| Synthesis Example 1 | A-1 | M-2 | 10 | M-1 | 50 | M-3 | 40 | — | — |
| Synthesis Example 2 | A-2 | M-2 | 10 | M-7 | 50 | M-3 | 40 | — | — |
| Synthesis Example 3 | A-3 | M-2 | 10 | M-8 | 35 | M-10 | 40 | M-15 | 15 |
| Synthesis Example 4 | A-4 | M-2 | 10 | M-9 | 35 | M-10 | 40 | M-16 | 15 |
| Synthesis Example 5 | A-5 | M-2 | 10 | M-7 | 40 | M-3/M-14 | 40/14 | — | — |
| Synthesis Example 6 | A-6 | M-2 | 10 | M-1 | 50 | M-11/M-13 | 10/40 | — | — |
| Synthesis Example 7 | A-7 | M-2 | 10 | M-1 | 50 | M-12 | 40 | — | — |
| Synthesis Example 8 | A-8 | M-2 | 10 | M-1 | 50 | M-13 | 40 | — | — |
| Synthesis Example 9 | A-9 | M-17 | 10 | M-1 | 50 | M-3 | 40 | — | — |
| Synthesis Example 10 | A-10 | M-18 | 10 | M-1 | 50 | M-3 | 40 | — | — |
| Synthesis Example 11 | A-11 | M-2 | 40 | M-1/M-8 | 45/15 | — | — | — | — |
| Synthesis Example 12 | A-12 | M-2 | 40 | M-7/M-8 | 45/15 | — | — | — | — |

TABLE 1-continued

| | | | | | | | | |
|---|---|---|---|---|---|---|---|---|
| Synthesis Example 13 | a-1 | — | — | M-1 | 50 | M-3/M-4 | 40/10 | — | — |
| Synthesis Example 14 | a-2 | — | — | M-1 | 50 | M-3 | 50 | — | — |

| | AIBN | Content (mol %) of each structural unit | | | | Property value | |
|---|---|---|---|---|---|---|---|
| | Amount (mol %) | Structural unit (I) | Structural unit (II) | Structural unit (III) | Structural unit (IV) | Mw | Mw/Mn |
| Synthesis Example 1 | 5 | 10.0 | 48.0 | 42.0 | — | 5,100 | 1.34 |
| Synthesis Example 2 | 5 | 9.5 | 48.5 | 42 | — | 5,100 | 1.38 |
| Synthesis Example 3 | 5 | 8.9 | 33.6 | 41.3 | 16.2 | 5,600 | 1.39 |
| Synthesis Example 4 | 5 | 9.2 | 32 | 44.2 | 14.6 | 5,500 | 1.40 |
| Synthesis Example 5 | 5 | 8.8 | 38.7 | 41.3/11.2 | — | 4,900 | 1.33 |
| Synthesis Example 6 | 5 | 9.4 | 47.7 | 10.5/32.4 | — | 5,300 | 1.38 |
| Synthesis Example 7 | 5 | 8.5 | 38.6 | 52.9 | — | 5,100 | 1.35 |
| Synthesis Example 8 | 5 | 9.2 | 38.4 | 52.4 | — | 5,700 | 1.38 |
| Synthesis Example 9 | 5 | 8.2 | 37.6 | 54.2 | — | 5,600 | 1.36 |
| Synthesis Example 10 | 5 | 9.0 | 38.2 | 52.8 | — | 5,400 | 1.34 |
| Synthesis Example 11 | 5 | 39.5 | 44.3/16.2 | — | — | 6,900 | 1.43 |
| Synthesis Example 12 | 5 | 39.2 | 45.1/15.7 | — | — | 7,000 | 1.49 |
| Synthesis Example 13 | 10 | — | 48.0 | 42.0/10.0 | — | 5,100 | 1.35 |
| Synthesis Example 14 | 18 | — | 48.0 | 52.0 | — | 5,000 | 1.33 |

Synthesis of Water-Repellent Polymer Additive (C)

Synthesis Example 13

A monomer solution was prepared by dissolving 37.41 g (40 mol %) of the compound (M-5) and 62.59 g (60 mol %) of the compound (M-6) in 100 g of 2-butanone, and adding 4.79 g (7 mol %) of AIBN to the solution. A three-necked flask (1000 ml) charged with 100 g of 2-butanone was purged with nitrogen for 30 minutes, and heated to 80° C. with stirring. The monomer solution was added dropwise to the flask over 3 hours using a dropping funnel. The monomers were polymerized for 6 hours from the start of dropwise addition of the monomer solution. After completion of polymerization, the polymer solution was cooled with water to 30° C. or less. The polymer solution was concentrated under reduced pressure using an evaporator until the weight of the polymer solution was 150 g. The concentrate was added to a mixture of 760 g of methanol and 40 g of water. A slime-like white solid precipitated by this operation. After removing the liquid by decantation, the solid was dried at 50° C. for 17 hours to obtain a white powdery polymer (C-1) (47 g, yield: 47%). The copolymer (C-1) had an Mw of 3700 and a dispersity (Mw/Mn) of 1.40. The ratio of structural units derived from the compounds (M-5) and (M-6) in the polymer (C-1) as determined by $^{13}$C-NMR analysis was 42.5:57.5 (mol %).

Preparation of Photoresist Composition

The photoacid generator (B), the acid diffusion controller (D), and the solvent (E) used to produce the photoresist composition of the examples and comparative examples are listed below.

Acid Generator (B)
B-1: triphenylsulfonium 1,1,2,2-tetrafluoro-6-(1-adamantanecarbonyloxy)hexane-1-sulfonate (compound shown by the following formula (B-1))
B-2: triphenylsulfonium 2-(adamantan-1-yl)-1,1-difluoroethane-1-sulfonate (compound shown by the following formula (B-2))

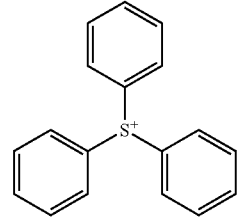

(B-1)

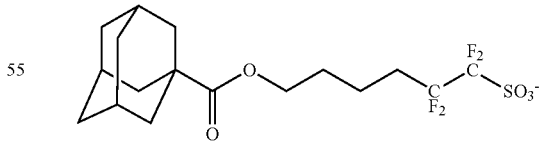

(B-2)

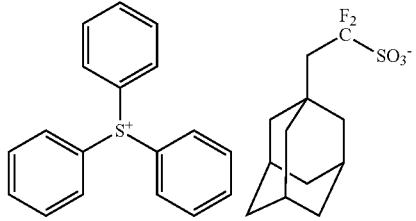

Acid Diffusion Controller (D)
D-1: triphenylsulfonium salicylate (compound shown by the following formula (D-1))
D-2: N-(t-pentyloxycarbonyl)-4-hydroxypiperidine (compound shown by the following formula (D-2))

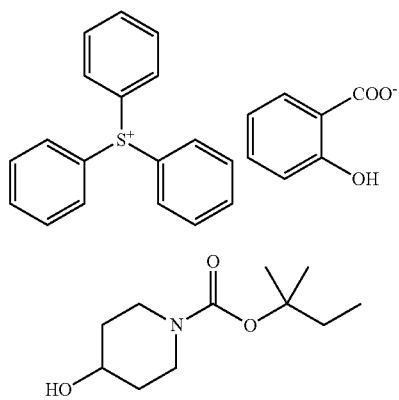

Solvent (E)
E-1: propylene glycol monomethyl ether acetate
E-2: cyclohexanone
E-3: γ-butyrolactone Example 1

100 parts by mass of the polymer (A-1) (polymer (A)), 10.4 parts by mass of the acid generator (B-1) (acid generator (B)), 3 parts by mass of the copolymer (C-1) (water-repellent polymer additive (C)), 7.3 parts by mass of the acid diffusion controller (D-1) (acid diffusion controller (D)), 2600 parts by mass of the solvent (E-1) (solvent (E)), 1100 parts by mass of the solvent (E-2) (solvent (E)), and 200 parts by mass of the solvent (E-3) (solvent (E)) were mixed to obtain a homogeneous solution. The solution was filtered through a membrane filter having a pore size of 200 nm to obtain a positive-tone photoresist composition (solid content: about 3 mass %).

Examples 2 to 14 and Comparative Examples 1 to 6

A photoresist composition was prepared in the same manner as in Example 1, except that the type and the amount of each component were changed as shown in Tables 2 to 3.
Formation (1) of Resist Pattern (Formation of Short Trench Pattern)

The photoresist composition of Example 1, Comparative Example 1, or Comparative Example 2 was applied to a 12-inch silicon wafer on which an underlayer antireflective film ("ARC66" manufactured by Nissan Chemical Industries, Ltd.) was formed. The photoresist composition was prebaked (PB) for 60 seconds at the temperature shown in Table 2 to form a resist film having a thickness of 75 nm. The resist film was exposed via a mask pattern for forming a short trench pattern (X-direction: 45 nm trench/80 nm pitch, Y-direction: 90 nm trench/112.5 nm pitch (after reduction projection)) using an ArF immersion scanner ("NSR S610C" manufactured by Nikon Corporation) (NA=1.3, ratio=0.800, Annular).

A dose at which a trench pattern (X-direction: 45 nm, Y-direction: 90 nm) was formed using the mask pattern was determined to be an optimum dose (1). After exposure, the resist film was subjected to PEB for 60 seconds at the temperature shown in Table 2. The resist film was then developed using a 2.38 mass % tetramethylammonium hydroxide aqueous solution, rinsed with water, and dried to form a positive-tone resist pattern.
Evaluation The performance of the photoresist composition was evaluated as described below using the resist pattern that was formed as described above. The results are shown in Table 2.
CDU The dimensions of the resist pattern formed at the optimum dose (1) were measured at 30 points in the X-direction and the Y-direction, respectively, and the mean deviation 36 of the thirty measured values was taken as CDU (nm) (CDU-X (X-direction) and CDU-Y (Y-direction)). A case where the CDU-X and the CDU-Y were 4.5 nm or less was evaluated as acceptable. The dimensions of the resist pattern were measured using a scanning electron microscope ("CG4000" manufactured by Hitachi High-Technologies Corporation).

TABLE 2

| | Component (A) | | Acid generator (B) | | Polymer (C) | | Acid diffusion controller (D) | | Solvent (E) | | PB temp. (° C.) | PEB temp. (° C.) | CDU-X (nm) | CDU-Y (nm) |
|---|---|---|---|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) | | | | |
| Example 1 | A-1 | 100 | B-1 | 10.4 | C-1 | 3 | D-1 | 7.3 | E-1/E-2/E-3 | 2,600/1,100/200 | 100 | 90 | 4.4 | 4.5 |
| Comparative Example 1 | a-1 | 100 | B-1 | 10.4 | C-1 | 3 | D-1 | 7.3 | E-1/E-2/E-3 | 2,600/1,100/200 | 100 | 90 | 4.6 | 5.0 |
| Comparative Example 2 | a-2 | 100 | B-1 | 10.4 | C-1 | 3 | D-1 | 7.3 | E-1/E-2/E-3 | 2,600/1,100/200 | 100 | 90 | 4.8 | 5.3 |

As is clear from the results shown in Table 4, it was confirmed that the resist pattern formed using the photoresist composition of Example 1 exhibited excellent CDU. Note that it is considered that similar resist performance (fine pattern) and similar evaluation results are obtained when using short-wavelength radiation (e.g., EUV light) instead of ArF excimer laser light.
Formation (2) of Resist Pattern (Formation of Line-and-Space Pattern)
When Using Alkali Development A positive-tone resist pattern was formed in the same manner as in the section entitled "Formation (1) of resist pattern", except that the photoresist compositions of Examples 2 to 11 and Comparative Examples 3 and 4, and a mask pattern for forming a 45 nm line-and-space pattern were used. A dose at which a 45 nm line-and-space resist pattern was formed using the mask pattern was determined to be an optimum dose (2).
When Using Organic Solvent Development A negative-tone resist pattern was formed in the same manner as the section entitled "Formation (1) of resist pattern", except that the photoresist compositions of Example 12 and Comparative Examples 5 and 6, and a mask pattern for forming a 45 nm line-and-space pattern were used, and the resist film was developed using methyl n-pentyl ketone as the developer, rinsed with 4-methyl-2-pentanol, and then dried. A dose at which a 45 nm line-and-space resist pattern was formed using the mask pattern was determined to be an optimum dose (3).

Evaluation

LWR

The resist pattern formed at the optimum dose (optimum dose (2) or (3)) was observed from above using the aforementioned scanning electron microscope. The line width of the resist pattern was measured at an arbitrary 50 points, and the 3σ value was calculated from the distribution of the measured values, and taken as LWR (nm). The LWR value is shown in Tables 3 and 4. A small LWR value indicates that LWR was good. A case where the LWR value was less than 5 nm was evaluated as acceptable, and a case where the LWR value was 5 nm or more was evaluated as unacceptable.

Cross-Sectional Shape Rectangularity

The cross-sectional shape of the resist pattern resolved at the optimum dose (optimum dose (2) or (3)) was observed to measure a line width La at the top of the resist pattern and a line width Lb at the bottom of the resist pattern. The ratio "La/Lb" was calculated, and used as an index of cross-sectional shape rectangularity. A case where the ratio "La/Lb" was within the range of "0.9≤(La/Lb)≤1.1" was evaluated as "Acceptable", and a case where the ratio "La/Lb" was less than 0.9 ((La/Lb)<0.9) or more than 1.1 (1.1<(La/Lb)) was evaluated as "Unacceptable".

TABLE 3

| | Component (A) | | Acid generator (B) | | Polymer (C) | | Acid diffusion controller (D) | | Solvent (E) | | PB temp. (° C.) | PEB temp. (° C.) | LWR (nm) | Cross-sectional shape rectangularity |
|---|---|---|---|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) | | | | |
| Example 2 | A-1 | 100 | B-1 | 10.4 | C-1 | 3 | D-1 | 7.3 | E-1/E-2/E-3 | 2,600/1,100/200 | 100 | 95 | 4.7 | Acceptable |
| Example 3 | A-2 | 100 | B-1 | 10.4 | C-1 | 3 | D-1 | 7.3 | E-1/E-2/E-3 | 2,600/1,100/200 | 100 | 85 | 4.8 | Acceptable |
| Example 4 | A-3 | 100 | B-1 | 10.4 | C-1 | 3 | D-1 | 7.3 | E-1/E-2/E-3 | 2,600/1,100/200 | 100 | 110 | 4.9 | Acceptable |
| Example 5 | A-4 | 100 | B-1 | 10.4 | C-1 | 3 | D-1 | 7.3 | E-1/E-2/E-3 | 2,600/1,100/200 | 100 | 95 | 4.3 | Acceptable |
| Example 6 | A-5 | 100 | B-1 | 10.4 | C-1 | 3 | D-1 | 7.3 | E-1/E-2/E-3 | 2,600/1,100/200 | 100 | 85 | 4.6 | Acceptable |
| Example 7 | A-6 | 100 | B-1 | 10.4 | C-1 | 3 | D-1 | 7.3 | E-1/E-2/E-3 | 2,600/1,100/200 | 100 | 100 | 4.9 | Acceptable |
| Example 8 | A-7 | 100 | B-1 | 10.4 | C-1 | 3 | D-1 | 7.3 | E-1/E-2/E-3 | 2,600/1,100/200 | 100 | 100 | 4.8 | Acceptable |
| Example 9 | A-8 | 100 | B-1 | 10.4 | C-1 | 3 | D-1 | 7.3 | E-1/E-2/E-3 | 2,600/1,100/200 | 100 | 100 | 4.5 | Acceptable |
| Example 10 | A-9 | 100 | B-1 | 10.4 | C-1 | 3 | D-1 | 7.3 | E-1/E-2/E-3 | 2,600/1,100/200 | 100 | 100 | 4.8 | Acceptable |
| Example 11 | A-10 | 100 | B-1 | 10.4 | C-1 | 3 | D-1 | 7.3 | E-1/E-2/E-3 | 2,600/1,100/200 | 100 | 100 | 4.9 | Acceptable |
| Comparative Example 3 | a-1 | 100 | B-1 | 10.4 | C-1 | 3 | D-1 | 7.3 | E-1/E-2/E-3 | 2,600/1,100/200 | 100 | 100 | 5.2 | Unacceptable |
| Comparative Example 4 | a-2 | 100 | B-1 | 10.4 | C-1 | 3 | D-1 | 7.3 | E-1/E-2/E-3 | 2,600/1,100/200 | 100 | 100 | 5.5 | Unacceptable |

TABLE 4

| | Component (A) | | Acid generator (B) | | Polymer (C) | | Acid diffusion controller (D) | | Solvent (E) | | PB temp. (° C.) | PEB temp. (° C.) | LWR (nm) | Cross-sectional shape rectangularity |
|---|---|---|---|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) | | | | |
| Example 12 | A-1 | 100 | B-1 | 9 | C-1 | 3 | D-2 | 3.3 | E-1/E-2/E-3 | 1,920/820/30 | 100 | 100 | 4.2 | Acceptable |
| Example 13 | A-11 | 100 | B-2 | 7 | C-1 | 3 | D-2 | 0.8 | E-1/E-2/E-3 | 1,920/820/30 | 90 | 100 | 4 | Acceptable |
| Example 14 | A-12 | 100 | B-2 | 7 | C-1 | 3 | D-2 | 0.8 | E-1/E-2/E-3 | 1,920/820/30 | 90 | 90 | 3.5 | Acceptable |
| Comparative Example 5 | a-1 | 100 | B-1 | 9 | C-1 | 3 | D-2 | 3.3 | E-1/E-2/E-3 | 1,920/820/30 | 100 | 100 | 4.2 | Unacceptable |
| Comparative Example 6 | a-2 | 100 | B-1 | 9 | C-1 | 3 | D-2 | 3.3 | E-1/E-2/E-3 | 1,920/820/30 | 100 | 100 | 4.5 | Unacceptable |

As is clear from the results shown in Tables 3 and 4, it was confirmed that the photoresist compositions of the examples could form a resist pattern that exhibited small LWR and excellent cross-sectional shape rectangularity when using alkali development and organic solvent development.

The photoresist composition and the resist pattern-forming method according to the embodiments of the invention can form a resist pattern that exhibits excellent CDU, small LWR, and excellent cross-sectional shape rectangularity.

This makes it possible to stably form a fine pattern with high accuracy using the pattern-forming method that utilizes the photoresist composition and radiation such as KrF excimer laser light or ArF excimer laser light. The photoresist composition and the resist pattern-forming method may suitably be used for production of semiconductor devices that are expected to be further miniaturized in the future.

Obviously, numerous modifications and variations of the invention are possible in light of the above teachings. It is therefore to be understood that within the scope of the appended claims, the invention may be practiced otherwise than as specifically described herein.

What is claimed is:

1. A photoresist composition comprising:
   a polymer that comprises:
      a first structural unit shown by formula (1);
      a second structural unit comprising an acid-labile group and shown by formula (2); and
      a third structural unit comprising a lactone group, a cyclic carbonate group, a sultone group, or a combination thereof, and being other than the first structural unit; and
   an acid generator,

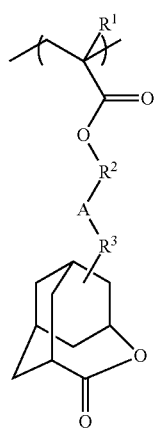

(1)

wherein
   $R^1$ represents a hydrogen atom, a fluorine atom, a methyl group, or a trifluoromethyl group,
   $R^2$ represents a divalent hydrocarbon group having 1 to 10 carbon atoms,
   A represents —COO—*, —OCO—*, —O—, —S—, or —NH—, wherein "*" indicates a site bonded to $R^3$, and
   $R^3$ represents a single bond or a divalent hydrocarbon group having 1 to 10 carbon atoms, $R^3$ being bonded to a carbon atom at a position other than a bridgehead position of the 5-oxo-4-oxatricyclo[4.3.1.1$^{3,8}$]undecane structure in the formula (1),

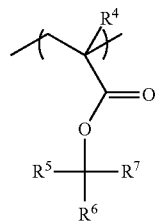

(2)

wherein
   $R^4$ represents a hydrogen atom, a fluorine atom, a methyl group, or a trifluoromethyl group, and
   $R^5$ to $R^7$ independently represent a linear or branched alkyl group having 1 to 10 carbon atoms, an alicyclic hydrocarbon group having 4 to 20 carbon atoms, or an aromatic hydrocarbon group having 6 to 20 carbon atoms, or
   $R^5$ represents a linear or branched alkyl group having 1 to 10 carbon atoms, an alicyclic hydrocarbon group having 4 to 20 carbon atoms, or an aromatic hydrocarbon group having 6 to 20 carbon atoms, and $R^6$ and $R^7$ taken together represent a divalent alicyclic hydrocarbon group having 4 to 20 carbon atoms together with the carbon atom bonded to $R^6$ and $R^7$,
   wherein a content of the first structural unit in the polymer is from 5 to 30 mol % based on 100 mol % of the polymer, a content of the second structural unit in the polymer is from 30 to 70 mol % based on 100 mol % of the polymer, and a content of the third structural unit in the polymer is from 20 to 60 mol % based on 100 mol % of the polymer.

2. The photoresist composition according to claim 1, wherein the second structural unit is a structural unit shown by formula (2-i), a structural unit shown by formula (2-ii), a structural unit shown by formula (2-iii), or a combination thereof,

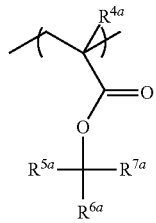

(2-i)

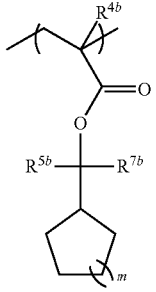

(2-ii)

-continued (2-iii)

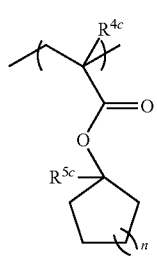

wherein
- each of $R^{4a}$ and $R^{4b}$, and $R^{4c}$ independently represents a hydrogen atom, a fluorine atom, a methyl group, or a trifluoromethyl group,
- each of $R^{5a}$, $R^{6a}$, and $R^{7a}$ independently represents a linear or branched alkyl group having 1 to 5 carbon atoms, wherein a total number of carbon atoms of the alkyl groups represented by $R^{5a}$, $R^{6a}$, and $R^{7a}$ is 7 or less,
- each of $R^{5b}$ and $R^{7b}$ independently represents a linear or branched alkyl group having 1 to 3 carbon atoms,
- m is an integer from 1 to 4,
- $R^{5c}$ represents a linear or branched alkyl group having 1 to 4 carbon atoms, and
- n is an integer from 1 to 4.

3. The photoresist composition according to claim 1, wherein the acid generator has an alicyclic structure having 8 to 30 carbon atoms.

4. The photoresist composition according to claim 1, further comprising a water-repellent polymer additive that comprises a fluorine atom.

5. A resist pattern-forming method comprising:
applying the photoresist composition according to claim 1 on a substrate to form a resist film;
exposing the resist film; and
developing the exposed resist film.

6. The photoresist composition according to claim 1, wherein $R^3$ is bonded to a carbon atom at a position 2 of the 5-oxo-4-oxatricyclo[4.3.1.1$^{3,8}$]undecane structure in the formula (1).

7. The photoresist composition according to claim 1, wherein the content of the first structural unit in the polymer is from 5 to 20 mol % to 100 mol % of the polymer.

8. The photoresist composition according to claim 1, wherein $R^2$ is a methanediyl group.

9. The photoresist composition according to claim 1, wherein $R^2$ is a 1,1-ethanediyl group.

10. The photoresist composition according to claim 1, wherein $R^2$ is a 1,4-cyclohexanediyl group.

11. The photoresist composition according to claim 1, wherein the third structural unit comprises a lactone group.

12. The photoresist composition according to claim 1, wherein the third structural unit comprises a norbornanelactone structure.

13. The photoresist composition according to claim 1, wherein the third structural unit comprises a norbornanelactone group substituted with a methoxycarbonyl group.

14. The photoresist composition according to claim 6, wherein the third structural unit comprises a lactone group.

15. The photoresist composition according to claim 6, wherein the third structural unit comprises a norbornanelactone structure.

16. The photoresist composition according to claim 6, wherein the third structural unit comprises a norbornanelactone group substituted with a methoxycarbonyl group.

* * * * *